(12) United States Patent
Xu et al.

(10) Patent No.: US 11,843,364 B2
(45) Date of Patent: *Dec. 12, 2023

(54) ACOUSTIC RESONATOR

(71) Applicants: II-VI Delaware, Inc, Wilmington, DE (US); University of South Florida, Tampa, FL (US)

(72) Inventors: Wen-Qing Xu, Medfield, MA (US); Di Lan, Tampa, FL (US); Jing Wang, Tampa, FL (US); Weiqi Li, San Jose, CA (US); Xu Han, Tampa, FL (US); Chao Liu, Butler, PA (US); Elgin Eissler, Renfrew, PA (US); Giovanni Barbarossa, Saratoga, CA (US)

(73) Assignees: II-VI DELAWARE, INC., Wilmington, DE (US); UNIVERSITY OF SOUTH FLORIDA, Tampa, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/535,868

(22) Filed: Nov. 26, 2021

(65) Prior Publication Data

US 2022/0085790 A1     Mar. 17, 2022

Related U.S. Application Data

(63) Continuation of application No. 16/208,857, filed on Dec. 4, 2018, now Pat. No. 11,218,132.

(Continued)

(51) Int. Cl.
*H03H 9/17* (2006.01)
*H03H 9/13* (2006.01)
*H03H 9/02* (2006.01)

(52) U.S. Cl.
CPC ........ *H03H 9/171* (2013.01); *H03H 9/02102* (2013.01); *H03H 9/02228* (2013.01);
(Continued)

(58) Field of Classification Search
CPC ............... H03H 9/171; H03H 9/02338; H03H 9/02228; H03H 9/02275; H03H 9/175;
(Continued)

(56) References Cited

U.S. PATENT DOCUMENTS 11,218,132 B2 * 1/2022 Xu ..................... H03H 9/02102
2005/0168104 A1   8/2005 Bouche et al.
(Continued)

FOREIGN PATENT DOCUMENTS

CN           101997512 A       3/2011

*Primary Examiner* — Jeffrey M Shin
(74) *Attorney, Agent, or Firm* — Blank Rome LLP

(57) ABSTRACT

An acoustic resonator includes a piezoelectric stack including a piezoelectric layer having a top surface and a bottom surface, a top electrode layer disposed above the top surface, and a bottom electrode layer disposed below the bottom surface. A number of acoustic wave reflectors are disposed on a side of the bottom electrode layer opposite the piezoelectric layer. Each acoustic wave reflector includes a high acoustic impedance layer and may include a low acoustic impedance layer. The acoustic resonator may include a tether that extends laterally to a stacking direction of the layers of the piezoelectric stack. A supporting structure may be coupled to the tether opposite the acoustic resonator for anchoring the acoustic resonator. A mirror, one or more phononic crystals, or both may be positioned on proximate the tether opposite the acoustic resonator to avoid resonant waves from exiting the acoustic resonator in use.

20 Claims, 14 Drawing Sheets

Related U.S. Application Data

(60) Provisional application No. 62/597,662, filed on Dec. 12, 2017.

(52) U.S. Cl.
CPC .... *H03H 9/02275* (2013.01); *H03H 9/02338* (2013.01); *H03H 9/02448* (2013.01); *H03H 9/13* (2013.01); *H03H 9/175* (2013.01)

(58) Field of Classification Search
CPC ... H03H 9/02448; H03H 9/02102; H03H 9/13
See application file for complete search history.

(56) References Cited

U.S. PATENT DOCUMENTS

| | | |
|---|---|---|
| 2009/0142480 A1 | 6/2009 | Godshalk et al. |
| 2014/0075726 A1 | 3/2014 | Petit et al. |
| 2016/0182007 A1 | 6/2016 | Bhattacharjee |
| 2016/0365842 A1 | 12/2016 | Marksteiner |

\* cited by examiner

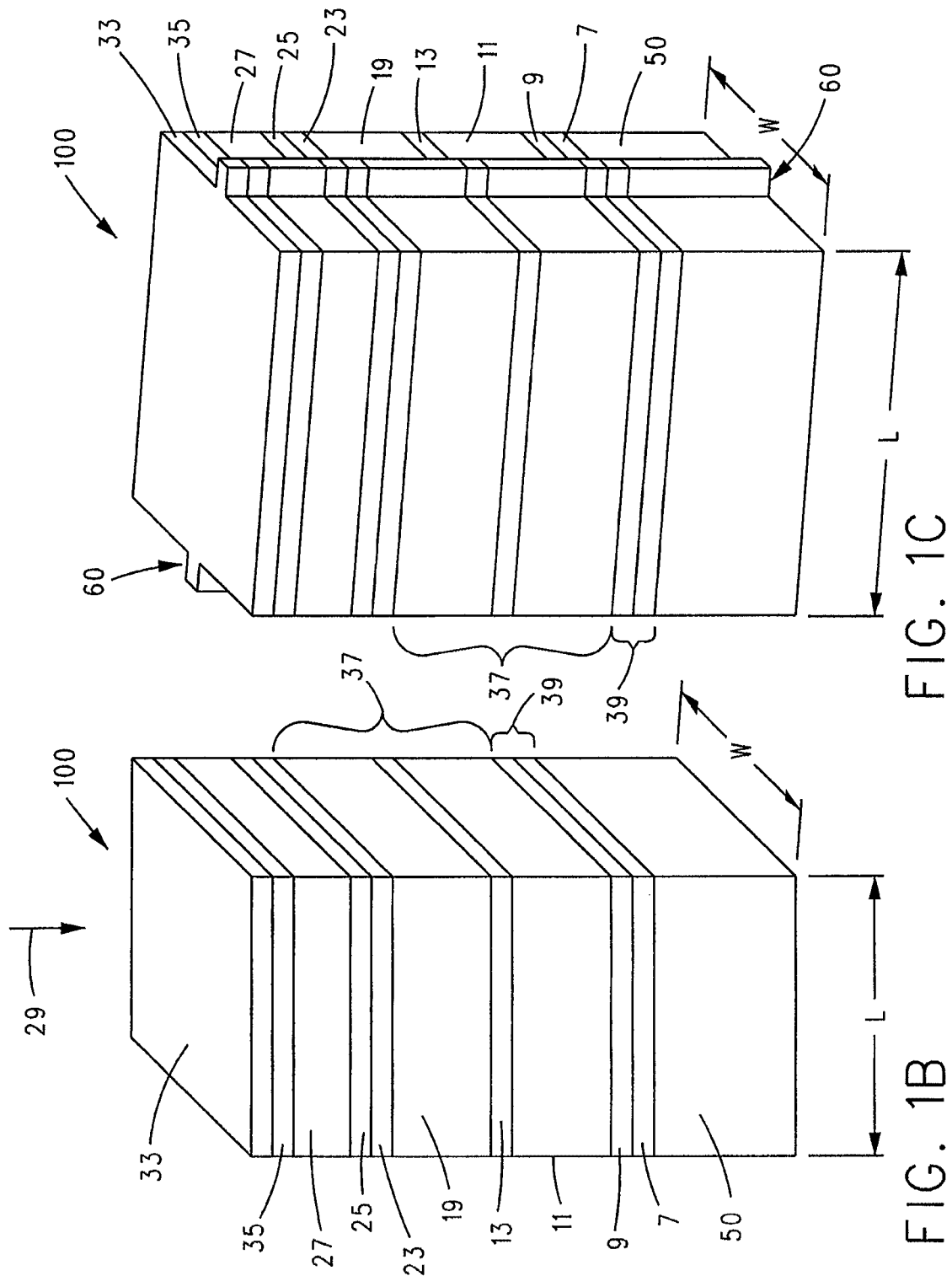

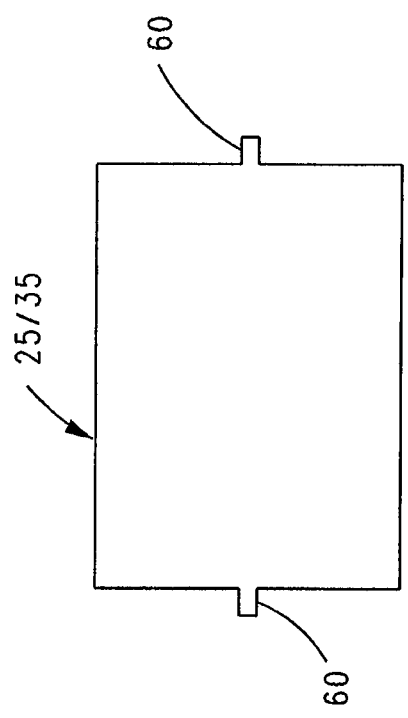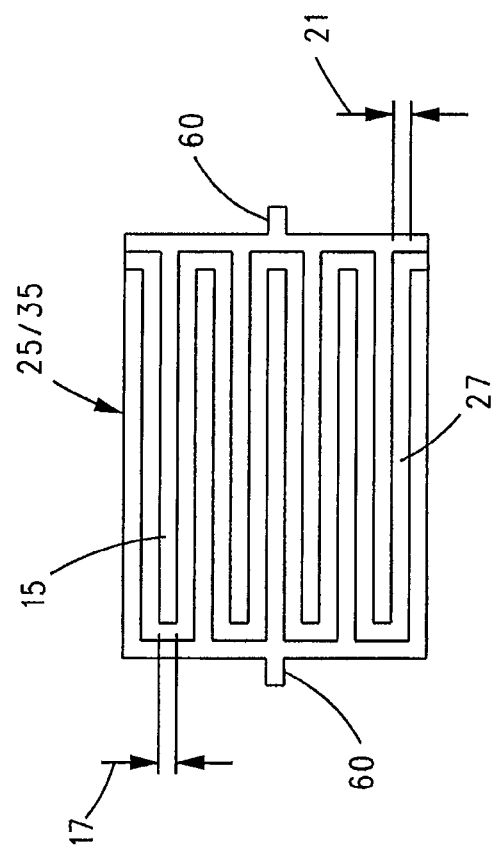
FIG. 2A
FIG. 2B

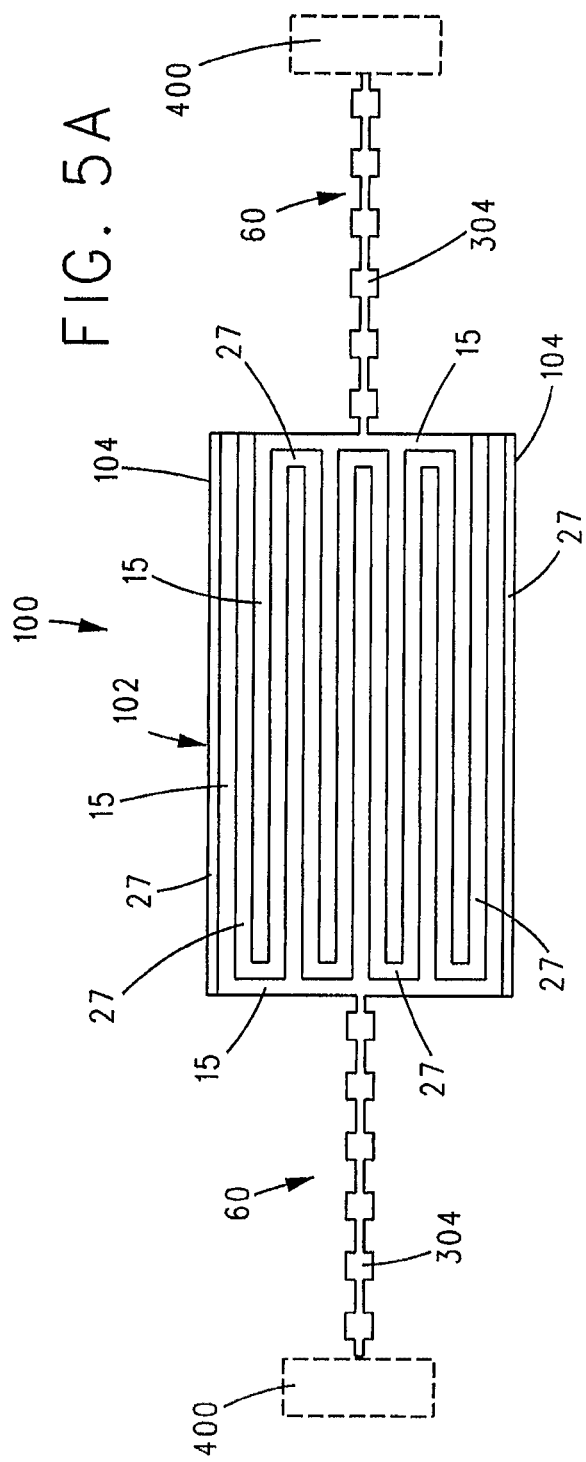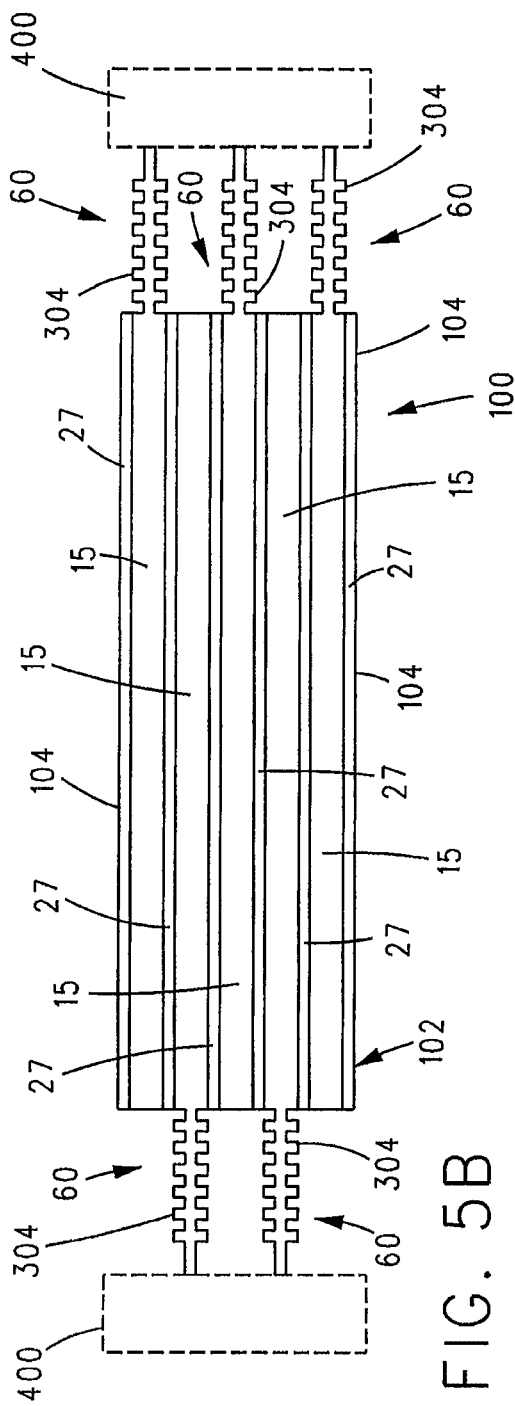

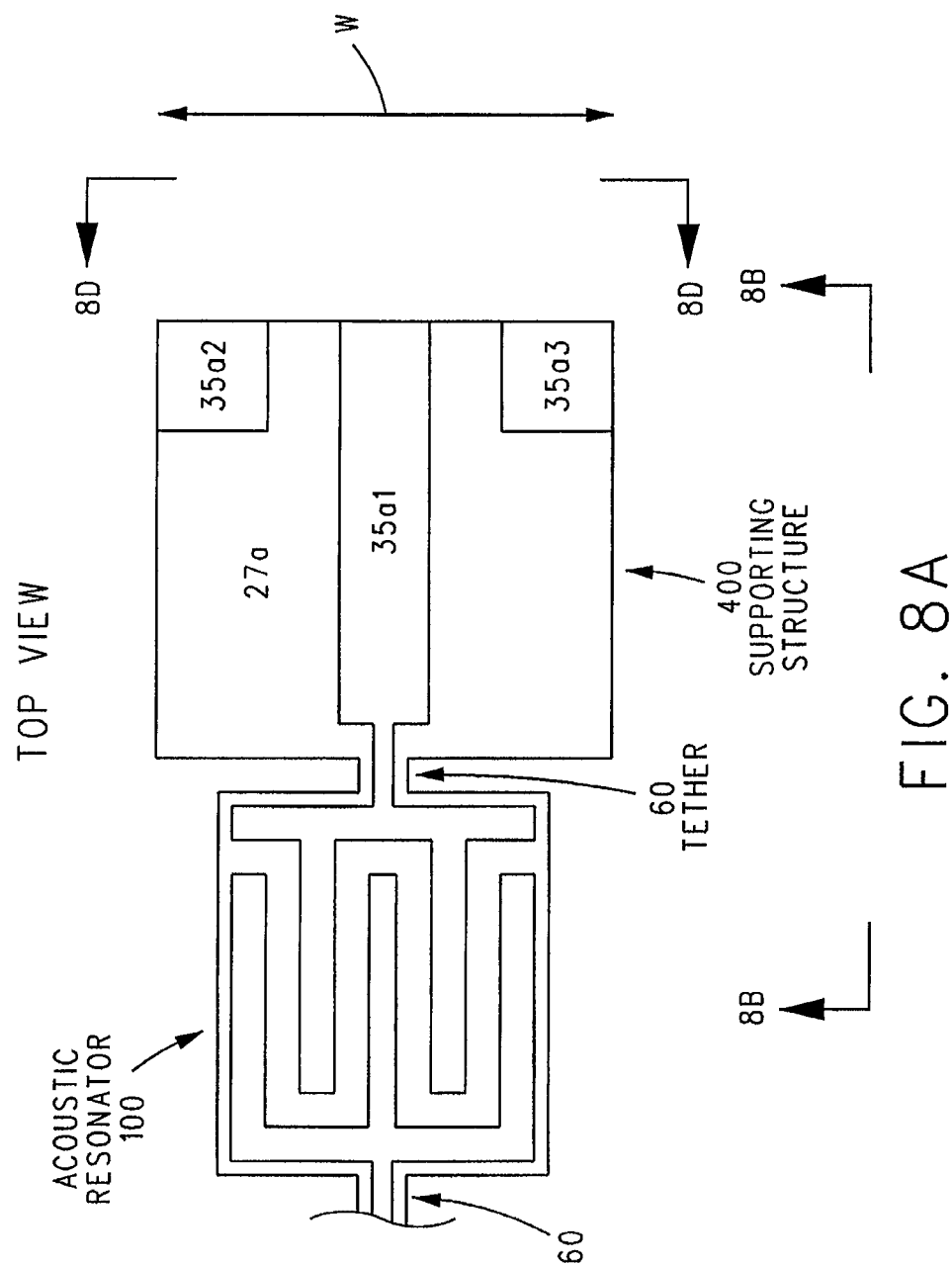

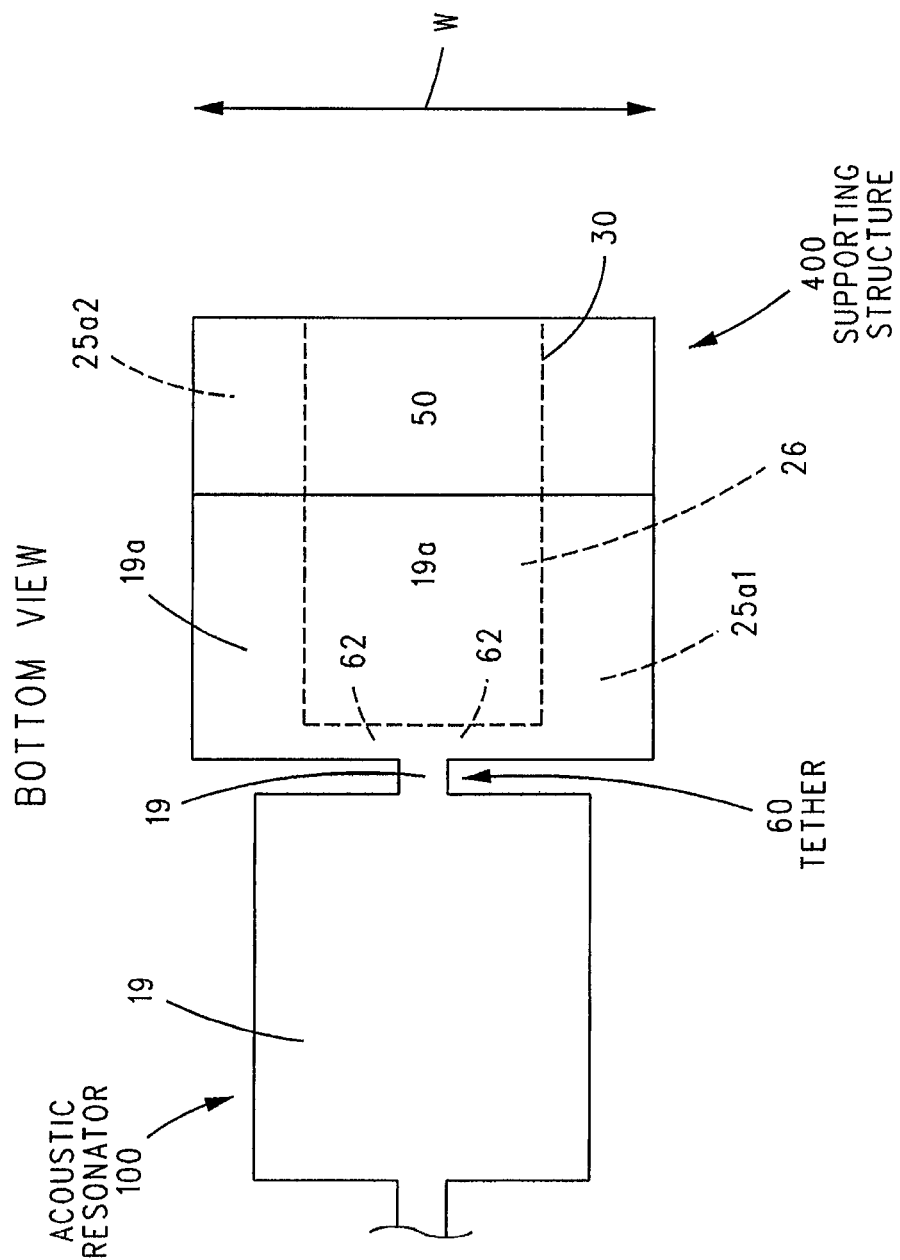

ACOUSTIC RESONATOR

CROSS REFERENCE TO RELATED APPLICATION

This application is a continuation of U.S. application Ser. No. 16/208,857, filed Dec. 4, 2018, which claims the benefit of U.S. provisional patent application No. 62/597,662, filed Dec. 12, 2017, the contents of both of which are incorporated herein by reference.

BACKGROUND OF THE INVENTION

Field of the Invention

The present invention relates to an acoustic resonator comprising electrodes, a piezoelectric layer, and acoustic reflectors.

Description of Related Art

In radio frequency (RF) communications, RF signals can be filtered with surface-acoustic-wave (SAW) filters and bulk-acoustic-wave (BAW) filters. Film-bulk-acoustic-resonators (FBAR) and solid-mounted-resonators (SMR) are two types of BAW filters that are piezoelectric-driven micro-electro-mechanical-system (MEMS) devices that enable current RF communications, capable of resonating at a relatively high frequency with a relatively low insertion loss, as compared to SAW filter devices. These BAW filters comprise a piezoelectric layer, a top electrode, and a bottom electrode. The resonance frequency of these BAW filters is thickness-based or depends on the thickness of the thin films of the resonant body, e.g., the resonance frequency increases with decreasing thickness of the thin films of the resonant body. The film thickness of the resonant bodies is critical and has to be precisely controlled for a desirable resonance frequency. Industrially, it can be expensive and time consuming to trim different areas of the wafer with ion-milling to achieve a high level of thickness uniformity to attain a reasonable yield of FBAR and SMR for a targeted or specified RF frequency.

Future RF communication systems are expected to utilize frequencies from currently a few hundred MHz to 1.8 GHz for cellular communications (and 2.5 GHz for Wi-Fi communications) to 3-6 GHz (sub-6 GHz), and possibly, all the way up to 100 GHz. In order to be used at these frequencies, the film thickness for FBAR and SMR-based RF filters need to be reduced in order to increase the resonance frequency. Furthermore, the product of frequency and Quality-Factor (or Q) of FBAR and SMR devices are typically constant, which means that an increase in resonance frequency will lead to a decrease in Q. Decrease in Q is undesirable, particularly given that the state of art of FBAR and SMR's Q is approaching the theoretical limit (3,500) at a frequency 2.45 GHz or below. Therefore, doubling the frequency will lead to a reduction of Q value by a half, e.g., to 1,750, which is not desirable for making a RF devices such as a RF filter, a RF resonator, a RF switch, a RF oscillator, etc.

SUMMARY OF THE INVENTION

Generally, provided is an improved acoustic resonator.

In some non-limiting embodiments or examples, an acoustic resonator in accordance with principles of the present invention can comprise a piezoelectric layer disposed between a pair of electrodes.

In some non-limiting embodiments or examples, the acoustic resonator can include one or a plurality of acoustic wave reflectors, each of which can include a layer of a high acoustic impedance material and, optionally, a layer of a low acoustic impedance material. In some non-limiting embodiments or examples, the layer of high acoustic impedance material may be a layer of diamond having an acoustic impedance of about $630 \times 10^6$ N·s/m$^3$. In some non-limiting embodiments or examples, the number of layers of the acoustic wave reflector may be $\geq 2$, $\geq 10$, $\geq 20$, $\geq 50$, and $\geq 100$.

In some non-limiting embodiments or examples, the layer of high acoustic impedance material may comprise one or more of the following: a condensed or solid-phase material; ceramic; glass; a polymer; a crystal, a mineral, etc. In some non-limiting embodiments or examples, the solid-phase material may include one or more of the following: platinum, palladium, tungsten, molybdenum, chromium, titanium, and tantalum. In some non-limiting embodiments or examples, the solid-phase material may include one or more elements from one or more of Group IIIA, IVA, IB, IIB, IIIB, IVB, VB, VIB, VIIB, and VIIIB of the periodic table of the elements.

In some non-limiting embodiments or examples, the optional layer of a low acoustic impedance material may comprise a vacuum or a gas-phase material. In some non-limiting embodiments or examples, the gas-phase material may include one or more of the following: air hydrogen, nitrogen, carbon dioxide, carbon monoxide, oxygen, one of group VIIIA inert gases such as helium, neon, argon, krypton, xenon, etc., an organic material such as a hydrocarbon material or its substituted derivatives with different functional group, or a mixture comprising any of the foregoing.

In some non-limiting embodiments or examples, the layer of a low acoustic impedance material may comprise a liquid-phase material.

In some non-limiting embodiments or examples, the layer of a low acoustic impedance material may comprise a solid-phase material that may have a low acoustic impedance between $1 \times 10^6$ (e.g., ivory at $1.4 \times 10^6$ N·s/m$^3$) and $30 \times 10^6$ N·s/m$^3$ (e.g., alumina/sapphire at 25.5 N·s/m$^3$). In some non-limiting embodiments or examples, the solid-phase material can be comprised of metal having a low acoustic impedance between $1 \times 10^6$ (e.g., alkali metal potassium K at $1.4 \times 10^6$ N·s/m$^3$) and $100 \times 10^6$ N·s/m$^3$ (e.g., tungsten W $99.72 \times 10^6$ N·s/m$^3$).

In an example, each electrode can be a continuous layer or a patterned layer. In an example, the patterned layer can include a comb-shaped or interdigitated array of electrical conductor lines having between proximate pairs of electrical conductor lines a portion of the piezoelectric layer visible. In an example, the width of each electrical conductor line and the width of each portion of the piezoelectric layer visible therebetween can be between 0.00001 mm and 1 mm; 0.0001 mm and 0.1 mm; or 0.0001 mm and 0.01 mm. In an example, a ratio of the width of an electrical conductor line to the portion of the piezoelectric layer visible between proximate electrical conductor lines may vary, ranging from 0.001 to 1,000; 0.01 to 100; or 0.1 to 10.

In some non-limiting embodiments or examples, the spacing between a pair of proximate electrical conductor lines may vary from 1% to 99% of the width of the electrical conductor line having the smallest width. In some non-limiting embodiments or examples, the interdigitated electrical conductor lines may be a straight lines, arced lines, spiral lines, or any other geometric shaped lines. In some non-limiting embodiments or examples, different shapes of geometric electrical conductor lines may offer advantages of suppressing unwanted spurious modes of the acoustic resonance. In some non-limiting embodiments or examples, the ratio of one or more electrical conductor line(s) to that of one or more piezoelectric line(s) may vary for a given acoustic resonator, which may help to broaden the resonance bandwidth.

In some non-limiting embodiments or examples, the piezoelectric layer can comprise ZnO, AlN, InN, alkali metal and/or alkali earth metal niobate, alkali metal and/or alkali earth metal titanate, alkali metal and/or alkali earth metal tantalite, GaN, AlGaN, lead zirconate titanate (PZT), polymer, or a doped form of any of the foregoing. The piezoelectric layer may be polycrystalline or monocrystalline. Monocrystalline piezoelectric layer may be formed from a single crystal or from epitaxial growth. In some non-limiting embodiments or examples, the piezoelectric layer may be scandium doped AlN, which may have a higher level of piezoelectric coupling efficiency than undoped AlN.

In some non-limiting embodiments or examples, in a thickness mode of resonance of the acoustic resonator, the piezoelectric layer of the acoustic resonator comprising a layer of diamond as the high acoustic impedance layer can have a coupling efficiency $\geq 3\%$, $\geq 5\%$, $\geq 7\%$, $\geq 9\%$, $\geq 11\%$, or $\geq 13\%$. In some non-limiting embodiments or examples, in a contour or lateral mode of resonance of the acoustic resonator, the piezoelectric layer of the acoustic resonator comprising a layer of diamond as the high acoustic impedance layer can have a coupling efficiency $\geq 0.1\%$, $\geq 0.3\%$, $\geq 0.5\%$, $\geq 1.0\%$, $\geq 1.5\%$, $\geq 2.0\%$, $\geq 2.5\%$, $\geq 3.0\%$, $\geq 3.5\%$, $\geq 4.0\%$, or $\geq 4.5\%$.

In some non-limiting embodiments or examples, portions of the piezoelectric layer visible between proximate electrical conductor lines may be removed to form piezoelectric slot(s) in the body of piezoelectric layer. In an example, these piezoelectric slot(s) may reduce feedthrough capacitance ($C_0$) of the acoustic resonator; increase piezoelectric coupling efficiency; or increase $kT^2$, where $kT^2 = C_m/C_0$, and Cm is the equivalent motion capacitance. The piezoelectric slot(s) may decouple the piezoelectric response (motion current) and the electric response (direct feedthrough due to capacitive coupling) of the acoustic resonator which may improve a signal-to-noise ratio of the acoustic resonator.

In some non-limiting embodiments or examples, the body of the acoustic resonator may be rectangular, square, circular, annular, ring-shaped, polygon, ellipse, or any other geometric shape. In some non-limiting embodiments or examples, the dimensions of the acoustic resonator may depend on targeted performance(s) such as, for example, insertion loss, power handling capability, thermal dissipation, etc. In some non-limiting embodiments or examples, the largest dimension of the acoustic resonator may be $\leq 50$ mm, $\leq 30$ mm, $\leq 20$ mm, $\leq 10$ mm, $\leq 5$ mm, $\leq 3$ mm, $\leq 2$ mm, or $\leq 1$ mm. In an example, the insertion loss of the acoustic resonator may be $\leq 40$ dB, $\leq 30$ dB, $\leq 20$ dB, $\leq 15$ dB, or $\leq 10$ dB. To achieve low insertion loss (which can depend on the need of a particular application), the dimensions of the acoustic resonator may be varied (typically, the larger the device, the lower the insertion loss) or by putting multiple acoustic resonators in parallel. The power handling of the acoustic resonator can be $\leq 70$ dBm, $\leq 60$ dBm, $\leq 50$ dBm, $\leq 40$ dBm, $\leq 30$ dBm, or $\leq 20$ dBm.

In some non-limiting embodiments or examples, each acoustic wave reflector can reflect an acoustic wave back toward or into a body of the acoustic resonator when the acoustic wave reaches a boundary of the acoustic resonator.

In some non-limiting embodiments or examples, a single acoustic wave reflector comprising a layer of high acoustic impedance material and, optionally, a layer of low acoustic impedance material may not be able to achieve a desirable acoustic wave reflectance. Therefore, in an example, a multiple acoustic wave reflectors may be used particularly when using condensed-phase materials as high and. optionally, low acoustic impedance layers. In an example, the acoustic reflectance (R) of an acoustic wave may be calculated from the acoustic impedance (Za) of the layer in which the acoustic wave travels, e.g., the piezoelectric layer, and the acoustic impedance (Zb) of the layer which the travelling acoustic wave reaches, e.g., a high acoustic impedance layer, using the equation: $R = |(Zb-Za)/(Za+Zb)|$.

In an example, to achieve a desired acoustic reflectance, materials having different acoustic impedances may be chosen, or multiple layers of different acoustic impedance materials may be used. The maximum reflection of an acoustic wave can be 100%, if Zb is zero, which may occur under the condition of an absolute vacuum. Absent an absolute vacuum, Zb will have a numeric value greater than zero. As can be understood from an evaluation of the above equation, the higher the value of Za, the higher the acoustic reflectance (R) of an acoustic wave. Because diamond has one of the highest values (if not the highest value) of acoustic impedance, diamond can be a good material to use as the high acoustic impedance layer of an acoustic wave reflector for reflecting at least part of an acoustic wave produced by the acoustic resonator that reaches the high acoustic impedance layer.

In some non-limiting embodiments or examples, where the bottom electrode has the form of an interdigitated array of electrical conductor lines, acoustic wave energy may be directly transported from the piezoelectric layer into the diamond layer via the spaces or gaps between proximate interdigitated electrical conductor lines. In an example, the spaces or gaps between proximate interdigitated electrical conductor lines can be locations where resonant nodes occur, whereupon minimal acoustic wave transport occurs through these resonant node locations without having to travel through a first reflection interface between the piezoelectric layer and the bottom electrode layer and a second reflection interface between the bottom electrode layer and the high acoustic impedance layer, e.g., diamond. Therefore, in an example, it may be advantageous to have comb-shaped or interdigitated electrode lines between the piezoelectric layer and the high acoustic impedance layer, which can result in an improved quality factor (Q) and/or an improved insertion loss of the acoustic resonator.

In an example, diamond is known to be a low loss material for acoustic wave transport. Under resonant conditions of acoustic waves, diamond can store acoustic wave energy with minimal energy loss (relative to other materials), resulting in a high Q value, which is desirable. An acoustic resonator including an acoustic wave reflector comprising a layer of diamond can have a Q value $\geq 500$, $\geq 1,000$, $\geq 1,500$, $\geq 2,000$, $\geq 2,500$, $\geq 3,000$, $\geq 3,500$, $\geq 4,500$, or $\geq 5,500$.

Diamond as the material of the high acoustic impedance layer of an acoustic wave reflector can be a good material in avoiding frequency drift of the acoustic resonator as compared to other materials. For achieving an optimal and robust frequency stability over a range of $-40°$ C. to $+125°$ C. the acoustic resonator may include one or more temperature compensation layers.

In some non-limiting embodiments or examples, small tether(s) may be used to anchor the acoustic resonator to a supporting structure. The power handling capability of the acoustic resonator may be increased by increasing the number of tethers. The number of tethers may vary from 1 to 1000 or more. While each tether may be located at any location of the acoustic resonator for anchoring, acoustic wave nodal areas of the acoustic resonator may be desired locations to have tethers that can be used to anchor the acoustic resonator with minimal acoustic wave damping. However, acoustic wave damping cannot be completely eliminated by placing a tether at an acoustic wave nodal area since the tether, though small, is too large to prevent all of the acoustic wave from passing through the tether. Accordingly, in some non-limiting embodiments or examples, a means for reflecting acoustic waves exiting the body of the acoustic resonator via a tether back into said body may be located on a side of the tether opposite the acoustic resonator.

In some non-limiting embodiments or examples, the means for reflecting acoustic can be mirror that may be located on a side of a tether opposite the acoustic resonator. In an example, the mirror may reflect back≥20%, ≥40%, ≥60%, ≥80%, or ≥90% of the acoustic wave that is not confined inside the main body of the acoustic resonator. The mirror may be a single layer structure or a multilayered structure having alternating layers of different acoustic impedance materials. In an example, the mirror may comprise a gas phase material or mixture, a liquid phase material, or some combination thereof.

In some non-limiting embodiments or examples, the means for reflecting acoustic waves can be one or more sets of phononic crystals. In an example, each set of phononic crystals may aid in confining≥20%, ≥40%, ≥60%, ≥80%, ≥90%, ≥95%, or ≥99% of the acoustic wave inside the acoustic resonator body. Phononic crystals are known in the art as periodic arrangements of inclusions inside a viscoelastic material or a fluid, for example metal in air, polymer in water, air in epoxy, etc. (See "Phononic crystals and their applications" Pierre-Yves Guerder, Apr. 4th, 2011). The number, the shape, the size of these phononic crystals, and their geometric array may vary. The number of phononic crystals in any set of phononic crystals may range from 1 to 1,000,000; 1 to 100,000; 1 to 10,000; 1 to 1,000; or 1 to 100.

In some non-limiting embodiments or examples, phononic crystals can be disposed on a tether to aid in confining the acoustic wave inside the acoustic resonator. The phononic crystal(s) as part of the tether can create a band stop of frequencies that can avoid an acoustic wave from passing through the tether to the supporting structure. In an example, a phononic crystal-derived band stop of frequencies desirably includes the resonant frequency of the acoustic resonator, resulting in avoidance of acoustic energy from passing through the tether and being lost in the supporting structure and suppression of acoustic energy loss, which can result in a higher Q and a lower insertion loss.

BRIEF DESCRIPTION OF THE DRAWINGS

These and other features of the present invention will become more apparent from the following description in which reference is made to the appended drawings wherein:

FIG. 1B is a perspective view of the example acoustic resonator shown in FIG. 1A;

FIG. 1C is a perspective view of one non-limiting embodiment or example acoustic resonator including tethers in accordance with the principles of the present invention;

FIG. 2A is an plan view of one non-limiting embodiment or example continuous thin film (sheet) electric conductor that can be used as the top electrode, the bottom electrode, or both the top and bottom electrodes of the acoustic resonator shown in FIG. 1C;

FIG. 2B is a plan view of one non-limiting embodiment or example interdigitated electric conductor lines that can be used as the top electrode, the bottom electrode, or both the top and bottom electrodes of the acoustic resonator shown in FIG. 1C;

FIG. 5A is a plan view of one non-limiting embodiment or example acoustic resonator, e.g., similar to the acoustic resonator of any one of FIGS. 1A-1C, including two tethers, one tether at each end, wherein each tether includes one or more phononic crystals each configured to operate as a band stop filter;

FIG. 5B is a plan view of one non-limiting embodiment or example acoustic resonator, e.g., similar to the acoustic resonator of any one of FIGS. 1A-1C, that includes multiple tethers on each end, for example, two tethers on the left end and three tethers on the right end, wherein each tether includes one or more phononic crystals each configured to operate as a band stop filter;

FIGS. 8A-8D are top, side, bottom and end views of an example supporting structure coupled to an example acoustic resonator via a tether, wherein FIG. 8B is a view taken along lines 8B-8B in FIG. 8A, FIG. 8C is a view taken along lines 8C-8C in FIG. 8B, and FIG. 8D is a view taken along lines 8D-8D in FIG. 8A.

DESCRIPTION OF THE INVENTION

Various non-limiting examples will now be described with reference to the accompanying figures where like reference numbers correspond to like or functionally equivalent elements.

For purposes of the description hereinafter, the terms "upper", "lower", "right", "left", "vertical", "horizontal", "top", "bottom", "lateral", "longitudinal" and derivatives thereof shall relate to the examples as oriented in the figures.

It is to be understood that the invention may assume various alternative variations and step sequences, except where expressly specified to the contrary. It is also to be understood that the specific devices and processes illustrated in the attached drawings, and described in the following specification, are simply exemplary embodiments of the invention. Hence, specific dimensions and other physical characteristics related to the embodiments disclosed herein are not to be considered as limiting.

Figure 1A:
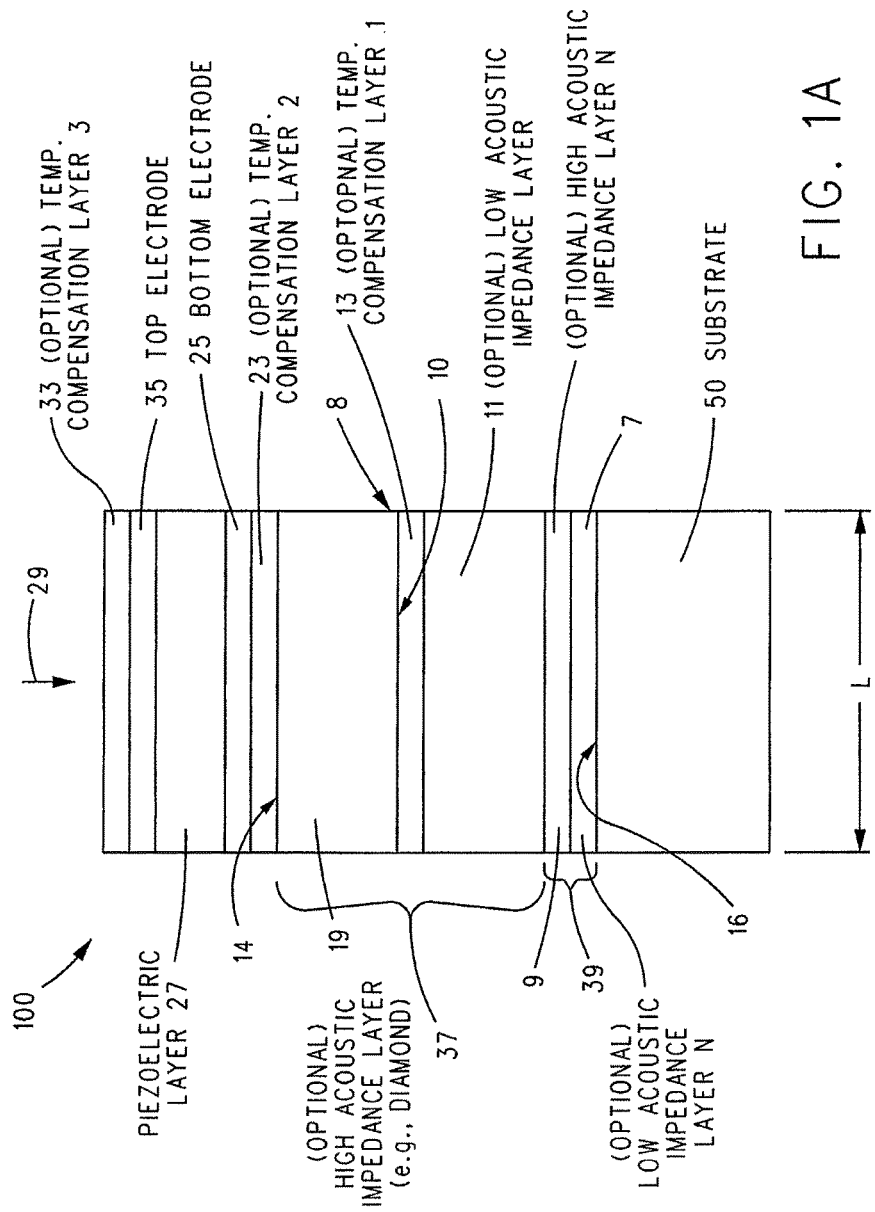
FIG. 1A is an enlarged side view of one non-limiting embodiment or example acoustic resonator in accordance with the principles of the present invention.

Referring to FIGS. 1A-1B, in some non-limiting embodiments or examples, an acoustic resonator 100 can comprise a resonator body that has a resonant frequency. Depending on its configuration, the an acoustic resonator 100 may have a resonant frequency $\geq 1$ MHz; $\geq 10$ MHz; $\geq 100$ MHz; 300 MHz; $\geq 500$ MHz; $\geq 800$ MHz; $\geq 1,200$ MHz; $\geq 1,500$ MHz; $\geq 1,800$ MHz; $\geq 2,100$ MHz; $\geq 2,400$ MHz; $\geq 2,700$ MHz; $\geq 3,000$ MHz; $\geq 3,500$ MHz; $\geq 4,000$ MHz; $\geq 4,500$ MHz; $\geq 5,000$ MHz; or $\geq 6,000$ MHz. The acoustic resonator 100 may resonate under a fundamental mode or under an overtone mode.

In some non-limiting embodiments or examples, acoustic resonator 100 can comprise a piezoelectric layer 27 that can be disposed between and activated by at least one pair of electrodes, e.g., a top electrode 25 layer and a bottom electrode 35 layer. In a top-down view (shown by arrow 29), the body of acoustic resonator 100 can be any suitable and/or desirable shape, such as, for example, rectangle, square, circle, annular, ring, polygon, ellipse, or any other geometric shape.

Referring to FIG. 1C and with continuing reference to FIGS. 1A-1B, in some non-limiting embodiments or examples, acoustic resonator 100 may be isolated from the environment via one or more tethers 60. In an example, each tether 60 may be formed from the same stack of materials as acoustic resonator 100 and can be used to anchor and isolate the body of acoustic resonator 100 from the environment. In an example, the number of the tethers 60 may vary from 1 to 1000 or more. In an example, the use of tether(s) 60 can be optional, depending on the isolation method and the design of an acoustic wave reflector (described in more detail hereinafter).

In some non-limiting embodiments or examples, top electrode 35 may be in contact with the top of piezoelectric layer 27 and bottom electrode 25 may be in contact with the bottom of piezoelectric layer 27. However, this is not to be construed in a limiting sense. In an example, either electrode or both electrodes 25 and 35 may be a layer of continuous thin film of electrical conductor as shown in FIG. 2A. In another example, either electrode or both electrodes 25 and 35 may comprise a comb-shaped or interdigitated array of thin film electrical conductor(s) as shown in FIG. 2B. In an example, each tether 60 may extend laterally from a side or end of acoustic resonator 100, i.e., laterally to a stacking direction of bottom electrode 25, piezoelectric layer 27, and top electrode 35. In an example, top electrode 35 may comprise a layer of continuous thin film of electrical conductor (FIG. 2A) and bottom electrode 25 may comprise a comb-shaped or interdigitated array of thin film electrical conductor(s) (FIG. 2B). In another example, bottom electrode 25 may comprise a layer of continuous thin film of electrical conductor (FIG. 2A) and top electrode 35 may comprise a comb-shaped or interdigitated array of thin film electrical conductor(s) (FIG. 2B). However, these configurations of bottom electrode 25 and top electrode 35 are not to be construed in a limiting sense.

In some non-limiting embodiments or examples, for each electrode 25 and/or 35 that comprises a combed-shaped or interdigitated array of thin film electrical conductors, the width 17 of each electrical conductor line 15 and the width 21 of each line of piezoelectric layer 27 visible between proximate electrical conductor lines 15 may vary. A ratio of the width 17 of each electrical conductor line 15 to the width 21 of each line of piezoelectric layer 27 can range from 0.001 to 1,000; 0.01 to 100; or 0.1 to 10, etc. For a pair of proximate comb-shaped or interdigitated electrical conductor lines, the distance between facing sides of said proximate electrical conductor lines may vary, ranging from 1% to 99% of the width 17 of one of said electrical conductor lines 15. In an example, the ratio of the width 17 of an electrical conductor line 15 to the width 21 of a line of piezoelectric layer 27 between proximate electrical conductor lines 15 may not be uniform for a given device, which may help to broaden the resonance bandwidth.

In some non-limiting embodiments or examples, the conductor lines 15 of the comb-shaped or interdigitated array of thin film electrical conductors may be straight lines, arced lines, spiral lines, or any other shaped geometric lines. Different shapes of geometric lines may offer advantages of suppressing unwanted spurious modes of the acoustic resonances.

In some non-limiting embodiments or examples, acoustic resonator 100 may include, in addition to top electrode 35, piezoelectric layer 27, and bottom electrode 25, one or more of the following: a high acoustic impedance layer 19, a low acoustic impedance layer 11, a substrate 50, and/or one or more optional temperature compensation layers 13, 23, and 33 disposed as shown, for example, in FIG. 1A. In another example, one or more optional low acoustic impedance layers 7 and/or one or more optional high acoustic impedance layers 9 may also be provided along with high acoustic impedance layer 19 and/or optional low acoustic impedance layer 11 as shown in FIG. 1A.

In some non-limiting embodiments or examples, low acoustic impedance layer 7 and high acoustic impedance layer 9 can be provided in pairs N and one or more instances of said pairs N can be provided. For example, a single pair N of low acoustic impedance layer 7 and high acoustic impedance layer 9 can be provided as shown in FIGS. 1A-1C. In another example, multiple pairs N of alternating low acoustic impedance layers 7 and high acoustic impedance layers 9 can be provided. For example, in a direction moving upward from substrate 50 toward piezoelectric layer 27, N pairs of alternating low acoustic impedance layers 7 and high acoustic impedance layers 9 can include a $1^{st}$ low acoustic impedance layer 7, a $1^{st}$ high acoustic impedance layer 9, a $2^{nd}$ low acoustic impedance layer 7, and a $2^{nd}$ high acoustic impedance layers 9. Additional, pairs N of alternating low acoustic impedance layers 7 and/or high acoustic impedance layers 9 may also be provided atop of $2^{nd}$ high acoustic impedance layer 9 of this example.

In some non-limiting embodiments or examples, the dimensions of acoustic resonator 100 can depend on one or more targeted performances such as insertion loss, power handling capability, thermal dissipation, etc. For example, when used with a hand-held device, e.g., a smartphone, the largest dimension of acoustic resonator 10 can be $\leq 20$ mm, $\leq 15$ mm, $\leq 10$ mm, $\leq 5$ mm, $\leq 3$ mm, $\leq 2$ mm, or $\leq 1$ mm. In an example, the insertion loss of acoustic resonator 10 used with a hand-held device can be $\leq 40$ dB, $\leq 30$ dB, $\leq 20$ dB, or $\leq 15$ dB.

In some non-limiting embodiments or examples, when the body of acoustic resonator 100 may have a quadrilateral shape (as viewed in a direction of arrow 29), the width W to length L ratio the body of acoustic resonator 100 may vary, from 0.01 to 100; 0.05 to 20; or 0.1 to 10. In an example, each side or end of the body of acoustic resonator 100 does not have to be parallel, or perpendicular to an opposite side or end.

In some non-limiting embodiments or examples, for base station applications and Internet of Things applications (devices around houses, offices, vehicles, etc.), the largest dimension of acoustic resonator 100 can be ≤50 mm; ≤30 mm; ≤20 mm; ≤10 mm; ≤5 mm; ≤3 mm; ≤2 mm; or ≤1 mm. In an example, the insertion loss of acoustic resonator 100 used with a base-station device and a device for Internet of Things can be ≤40 dB; ≤30 dB; ≤20 dB; ≤15 dB; or ≤10 dB.

In some non-limiting embodiments or examples, to achieve low insertion loss (which can depend on the need of a particular application), the dimensions of acoustic resonator 100 may be varied, typically, the larger the device, the lower the insertion loss. In an example, low insertion loss can also be achieved connecting multiple acoustic resonators 100 in parallel. In an example, the power handling of acoustic resonator 100 can be ≤70 dBm; ≤60 dBm; ≤50 dBm; ≤40 dBm; ≤30 dBm; or ≤20 dBm. In an example, power handling can be improved by using an increased number of tethers 60 to anchor the body of acoustic resonator 100.

In some non-limiting embodiments or examples, acoustic resonator 100 comprising piezoelectric layer 27, and at bottom and top electrodes 25 and 35 can further comprise an optional multilayer acoustic wave reflector 37 comprising high acoustic impedance layer 19 (e.g., a diamond film or layer) and, optionally, a low acoustic impedance layer 11. The illustration in FIGS. 1A-1C of acoustic wave reflector 37 including optional temperature compensation layer 13 is not to be construed in a limiting sense since temperature compensation layer 13 may be omitted.

In some non-limiting embodiments or examples, high acoustic impedance layer 19 can be comprised of diamond. The acoustic impedance of a material is the product of acoustic velocity and the specific density of the material. In an example, acoustic waves can travel very-fast in diamond, about 18,500 m/s. In an example, diamond can have a specific density of 3,500 kg/m$^3$. In an example, diamond can have an acoustic impedance of about 630×10$^6$ N·s/m$^3$. In some non-limiting embodiments or examples, high acoustic impedance layer 19 can alternatively be comprised of a solid-phase material such as a metal (aluminum, platinum, palladium, tungsten, molybdenum, chromium, titanium, tantalum, or one or more elements from one or more of Group IIIA and/or Group IVA of the periodic table of the elements, or a transition metal from one or more of Group IB, IIB, IIIB, IVB, VB, VIB, VIIB, and/or VIIIB), ceramic, glass, polymer, etc. In an example, SiC has an acoustic impedance of about 427×10$^6$ N·s/m$^3$, Ir has an acoustic impedance of about 108×10$^6$ N·s/m$^3$, and W has an acoustic impedance of about 99.9×10$^6$ N·s/m$^3$.

In some non-limiting embodiments or examples, optional low acoustic impedance layer 11 may be comprised of a gas-phase material. In an example, the gas-phase material may include one or more of hydrogen, nitrogen, carbon dioxide, carbon monoxide, oxygen, and/or one or more of group VIII inert gases such as helium, neon, argon, krypton, xenon, etc. In another example, the gas-phase material may be an organic material such as a hydrocarbon material or its substituted derivatives with different functional group. In another example, the gas-phase may be a mixture of any of the foregoing. In another example, other gas material(s) may also work as low acoustic impedance layer 11, though toxicity and hazard may be an issue. In an example, air may be a suitable gas-phase material or mixture that has a low acoustic impedance, about 0.0004×10$^6$ N·s/m$^3$.

In an example, a liquid-phase material may also work as low acoustic impedance layer 11, for example, water has an acoustic impedance of 1.48×10$^6$ N·s/m$^3$.

When a gas-phase or a liquid-phase material is used as low acoustic impedance layer 11 of acoustic wave reflector 37 of acoustic resonator 100, one or more tether(s) 60 can be used to anchor acoustic resonator 100. In some non-limiting embodiments or examples, the power handling capability of acoustic resonator 100 may be increased by increasing the number of tethers 60.

Ceramics, glass, crystals, and minerals may have a low acoustic impedance between 1×10$^6$ N·s/m$^3$ (such as ivory at 1.4×10$^6$ N·s/m$^3$) and 30×10$^6$ N·s/m$^3$ (such as alumina/sapphire at 25.5 N·s/m$^3$). Metal has an acoustic impedance between 1×10$^6$ (such as alkali metal K at 1.4×10$^6$ N·s/m$^3$) and 100×10$^6$ N·s/m$^3$ (such as tungsten, W, 99.72×10$^6$ N·s/m$^3$) and may, in an example acoustic wave reflector, function as the material of high acoustic impedance layer (e.g., layer 19), or low acoustic impedance layer (e.g., layer 11), depending on the selection of the material of the other layer 11 or 19, respectively. When a condensed-phase material is used as low acoustic impedance layer 11 of acoustic resonator 100, one or more tether(s) 60 may not needed because isolation of acoustic resonator 100 may not be necessary.

In some non-limiting embodiments or examples, in acoustic resonator 100, a first material may be used as the high or low acoustic impedance layer depending on the selection of a second material used as the other of the high and low acoustic impedance material. In a general, in acoustic resonator 100, a material considered to have a high acoustic impedance will have an acoustic impedance greater than a material considered to be a low acoustic impedance material regardless of the specific values of acoustic impedances associated with the high acoustic impedance layer and the low acoustic impedance layer. In some non-limiting embodiments or examples, a value of an acoustic reflectance (R) (discussed hereinafter) can be utilized to select appropriate materials to be used as the high acoustic impedance layer and the low acoustic impedance layer.

In some non-limiting embodiments or examples, acoustic wave reflector 37 can reflect acoustic wave(s) generated by piezoelectric layer 27 back into the body of acoustic resonator 100, comprising at least piezoelectric layer 27 and electrodes 25 and 35, when said acoustic wave(s) reach(es) a boundary or boundaries of acoustic wave reflector 37. In an example, acoustic wave reflector 37 can have an acoustic reflectance R of ≥50%, ≥60%, ≥70%, ≥80%, ≥90%, ≥95%, or ≥99%.

In some non-limiting embodiments or examples, acoustic wave reflector 37 comprising high acoustic impedance layer 19 and optional low acoustic impedance layer 11 may not have a desirable level of acoustic wave reflectance. Accordingly, in an example, a multilayered acoustic wave reflector can be used. An example of a multilayered acoustic wave reflector can include acoustic wave reflector 37 in addition to one or more acoustic wave reflectors 39, each comprising a high acoustic impedance layer 9 and, optionally, a low acoustic impedance layer 7. In one non-limiting embodiment or example, a multilayer acoustic wave reflector can include, in the order shown in FIGS. 1A-1C, acoustic wave reflector 37, comprising high acoustic impedance layer 19 and low acoustic impedance layer 11, and acoustic wave reflector 39, comprising high acoustic impedance layer 9 and low acoustic impedance layer 7. One or more additional instances of acoustic wave reflector 39 can be provided below the acoustic wave reflector 39 shown in FIGS. 1A-1C. In an example, the multilayered acoustic wave reflector can be used when condensed-phase materials are used as the high and low impedance layers. However, this is not to be construed in a limiting sense.

In some non-limiting embodiments or examples, the reflectance (R) of an acoustic wave can be calculated from the acoustic impedance (Za) of the layer in which the acoustic wave travels, e.g., without limitation, piezoelectric layer 27 and/or bottom electrode 25, and the acoustic impedance of the layer (Zb) which the acoustic wave reaches, e.g., without limitation, high acoustic impedance layer 19, using the following equation:

$$R=|(Zb-Za)/(Za+Zb)|$$

In some non-limiting embodiments or examples, to achieve desirable acoustic reflectance R, materials having different acoustic impedances may be used, or multiple layers of different acoustic impedances may be used. As can be understood from the above equation, maximum reflection of an acoustic wave is "1" when Zb is "0" (zero), which can occur under conditions of an absolute vacuum. Accordingly, in an example, acoustic resonator 100 can be mounted in a package under a certain level of vacuum which may help achieve better reflectance R of the acoustic wave, possibly resulting in a higher Q.

In some non-limiting embodiments or examples, the value of R may be ≥0.4. To achieve this value of R, any materials having suitable values of Za and Zb that are compatible with the process of forming acoustic resonator 100 may be used. Accordingly, the description herein of a material having a high or low acoustic impedance is for the purpose of illustration and is not to be construed in a limiting sense.

In some non-limiting embodiments or examples, if acoustic resonator 100 is not under an absolute vacuum, there can be a numeric value (greater than zero) of acoustic impedance for layer Zb. In this case, the higher the Zb, the higher the reflectance R of the acoustic wave. In an example, diamond is believed to be the material having the highest acoustic impedance Zb, which suggests that diamond may be a good, perhaps best, material to serve the high acoustic impedance layer 19 and/or 9 (when provided) of acoustic wave reflector 37 and/or 39 (when provided) of acoustic resonator 100 that can reflect the acoustic wave via acoustic reflections when the acoustic wave reaches a boundary (e.g., a top surface or a bottom surface of) high acoustic impedance layer 19 and/or 9 (when provided). Hence, acoustic resonator 100 can comprise one or more layers of diamond. The diamond may be monocrystalline or polycrystalline. Polycrystalline diamond may be ultrananocrystalline diamond, nanocrystalline diamond, or microcrystalline diamond.

Diamond is known to be a low loss material for acoustic wave transport. Under resonant conditions of acoustic waves, diamond may store acoustic wave energy with minimal energy loss, resulting in a high and desirable quality (Q) factor. Acoustic resonator 100 comprising one or more of high acoustic impedance layers (19 and/or 9 (when provided)) can have a Q≥500, ≥1,000, ≥1,500, ≥2,000, ≥2,500, ≥3,000, ≥3,500, ≥4,500, or ≥5,500. Other than diamond, other materials that can be used as high acoustic impedance layer(s) in acoustic resonator 100 can have a higher loss for acoustic wave transport.

In some non-limiting embodiments or examples, it may be desirable that acoustic waves formed by the piezoelectric stack of acoustic resonator 100 get quickly transported into a diamond layer, e.g., layer 19, resonating inside the diamond layer during resonance, which can lead to a higher Q.

In an example, the piezoelectric stack of acoustic resonator 100 can include piezoelectric layer 27, top electrode 35, and bottom electrode 25. Each of top electrode 35 and bottom electrode 25 can each have any suitable and/or desirable form or pattern such as, without limitation, a continuous thin film of electrical conductor, a comb-shaped or interdigitated pattern, etc.

In some non-limiting embodiments or examples, at least one layer of electrode (top electrode 35 and/or bottom electrode 25) may be needed to activate piezoelectric layer 27. In an example, bottom electrode 25 under piezoelectric layer 27 may (undesirably) serve as a reflection layer for the acoustic wave generated by piezoelectric layer 27, preventing or reducing the acoustic wave that is generated by piezoelectric layer 27 from travelling into high acoustic impedance layer 19. In an example, it, therefore, may be desirable for bottom electrode 25 between piezoelectric layer 27 and high acoustic impedance layer 19 to comprise a comb-shaped or interdigitated array of electrical conductor lines, as shown in FIG. 2B, or other geometric shapes that allow less reflection of the acoustic waves back to the piezoelectric stack that can have a higher loss of the acoustic wave energy. In this manner, acoustic wave energy from the piezoelectric stack can travel into or be transported into high acoustic impedance layer 19 among the gaps or spaces 27 of the comb-shaped or interdigitated electrical conductor lines.

In some non-limiting embodiments or examples, space(s) between proximate comb-shaped or interdigitated electrical conductor lines of bottom electrode 25, can be locations where resonant nodes occurs. Therefore, minimum amounts of acoustic waves can be transported through these nodal areas without having to pass through a first reflection interface between piezoelectric layer 27 and bottom electrode 25, and a second reflection interface between bottom electrode 25 and high acoustic impedance layer 19. Therefore, it can be desirable for bottom electrode 25 to have a comb-shaped or interdigitated array of electrical conductor lines 15 between piezoelectric layer 27 and diamond layer 19.

In some non-limiting embodiments or examples, while each tether 60 may be located at any location of acoustic resonator 100 for anchoring, an acoustic wave nodal area can be a desirable location for a tether 60 that can be used to anchor acoustic resonator 100 with minimal reduction in acoustic wave damping. However, acoustic wave damping may not be completely eliminated by placing a tether 60 at an acoustic wave nodal area since the tether 60, though small, is of sufficient size to allow some acoustic wave to pass through, resulting in a lower Q, which is not desirable.

In some non-limiting embodiments or examples, acoustic resonator 100 can optionally include any one or combination of one or more temperature compensation layers 13, 23 and/or 33 positioned as shown in FIGS. 1A and 1B. In some non-limiting embodiments or examples, acoustic resonator 100 can include multiple high and, optionally, low acoustic impedance layers 9 and 7, in addition to high acoustic impedance layer 19 and, optionally, low acoustic impedance layer 11. In an example, each low acoustic impedance layer 7 can be formed from the same or a different material than each other low acoustic impedance layer(s) 7 and/or 11. Similarly, each high acoustic impedance layer 9 can be formed from the same or different material than each other high acoustic impedance layer(s) 9 and/or 19.

In some non-limiting embodiments or examples, when acoustic resonator 100 is used as a radio-frequency or microwave electromagnetic wave filter and/or as an oscillator, it is desirable for the resonant frequency of acoustic resonator 100 to be robust, or stable, as the environment changes in temperature. However, the resonant frequency can change when the environment temperature changes, which is known as frequency drift, Δf/f, between temperatures of −40° C. and 125° C., which is not desirable.

In an example, diamond by itself can be a good material in avoiding temperature—based frequency drift as compared to other materials. However, achieving optimal and robust resonant frequency over a range of −40 to +125° C. may require acoustic resonator 100 to include one or more temperature compensation layers 13, 23, and 33. Each temperature compensation layer can comprise silicon dioxide, a silicon element, and/or an oxygen element. In an example, one or more temperature compensation layer(s) may be below diamond layer 19, above diamond layer 19, below bottom electrode 25, above piezoelectric layer 27, and/or above top electrode layer 35. Examples of temperature compensation layers 13, 23, and 33 are show in FIGS. 1A and 1B. The thickness of any temperature compensation layer may be ≤30 microns, ≤20 microns, ≤10 microns, ≤1 micron, or ≤0.4 microns. In some non-limiting embodiments or examples, the frequency drift of acoustic resonator 100 for every degree C. of temperature change can be ≤1000 ppm/° C., ≤500 ppm/° C., ≤300 ppm/° C., ≤100 ppm/° C., ≤50 ppm/° C., ≤30 ppm/° C., ≤20 ppm/° C., ≤10 ppm/° C., or ≤5 ppm/° C.

In some non-limiting embodiments or examples, piezoelectric layer 27 of acoustic resonator 100 can be activated by the application of a radio reference (Rf) signal applied between top and bottom electrodes 35, 25.

In some non-limiting embodiments or examples, piezoelectric layer 27 can be comprised of ZnO, AlN, InN, alkali metal and/or alkali earth metal niobate, alkali metal and/or alkali earth metal titanate, alkali metal and/or alkali earth metal tantalite, GaN, AlGaN, lead zirconate titanate (PZT), polymer, or a doped form of a piezoelectric layer that is described above.

In some non-limiting embodiments or examples, piezoelectric layer 27 formed of scandium doped AlN may offer a higher level of piezoelectric coupling efficiency than undoped AlN. In an example, however, piezoelectric layer 27 formed of scandium doped AlN may suffer in other material properties such as, for example, without limitation, a reduction in acoustic velocity which may adversely affect attaining resonant frequency, an increase in acoustic wave energy loss, and/or an increase in dielectric constant which can lead to a higher level of feedthrough (leading to a lower signal-to-noise ratio). In addition, doping of AlN forming piezoelectric layer 27 may also lead to acoustic resonator 100 dissipating more energy at resonant frequency, which can lead to a lower Q.

In some non-limiting embodiments or examples, an advantage of acoustic resonator 100 comprising at least one acoustic wave reflector 37 and/or 39 comprising at least one layer of diamond is that it helps avoid the above-mentioned disadvantages when using Sc-doped AlN for piezoelectric layer 27, or any doped piezoelectric layer, or any piezoelectric layer that may have a high coupling efficiency. In an example, piezoelectric layer 27 having a high coupling efficiency can be lossy (i.e., dissipate more energy) when resonating and can have a low acoustic velocity. In an example, diamond is known to be a low acoustic loss material and can have a high acoustic velocity, for example, the highest acoustic velocity of known materials. Acoustic resonator 100 comprising piezoelectric layer 27 having a high level of piezoelectric effect (coupling efficiency), such as Sc-doped AlN piezoelectric layer, and comprising at least one acoustic wave reflector 37 and/or 39 comprising a layer of diamond can achieve a high Q and high frequency resonance at the same time. The piezoelectric layer for acoustic resonator 100 comprising at least one acoustic wave reflector 37 and/or 39 comprising at least one layer of diamond can have a coupling efficiency≥3%, ≥5%, ≥7%, ≥9%, ≥11%, or ≥13% while operating in a thickness mode. The piezoelectric layer for acoustic resonator 100 comprising at least one acoustic wave reflector 37 and/or 39 comprising at least one layer of diamond while operating in a contour mode or in a lateral mode can have a coupling efficiency≥0.1%, ≥0.3%, ≥0.5%, ≥1.0%, ≥1.5%, ≥2.0%, ≥2.5%, ≥3.0%, ≥3.5%, ≥4.0%, or ≥4.5%.

The thickness of piezoelectric layer 27 can be between 10 nm and 1000 microns; or between 20 nm and 500 microns; or between 30 nm and 100 microns; or between 40 nm and 50 microns; or between 50 nm and 20 microns; or between 60 nm and 10 microns. The ratio of the thickness of diamond layer 19 or 9 to the thickness of the piezoelectric layer 27 may be >10,000; >1,000; >100; >50; >20; >10; >1; or >0.1. Piezoelectric layer 27 may cover a surface of diamond layer 19 completely, or partially, for example≥10%, ≥30%, ≥50%, ≥70%, ≥80%, or ≥90%.

Piezoelectric layer 27 may be polycrystalline or monocrystalline. Monocrystalline piezoelectric layer may be from a single crystal or from an epitaxial growth.

Next described are some non-limiting embodiments or examples of reducing acoustic wave loss using tethers 60 for an improvement in Q and, possibly, a reduction in insertion loss.

Figure 3:
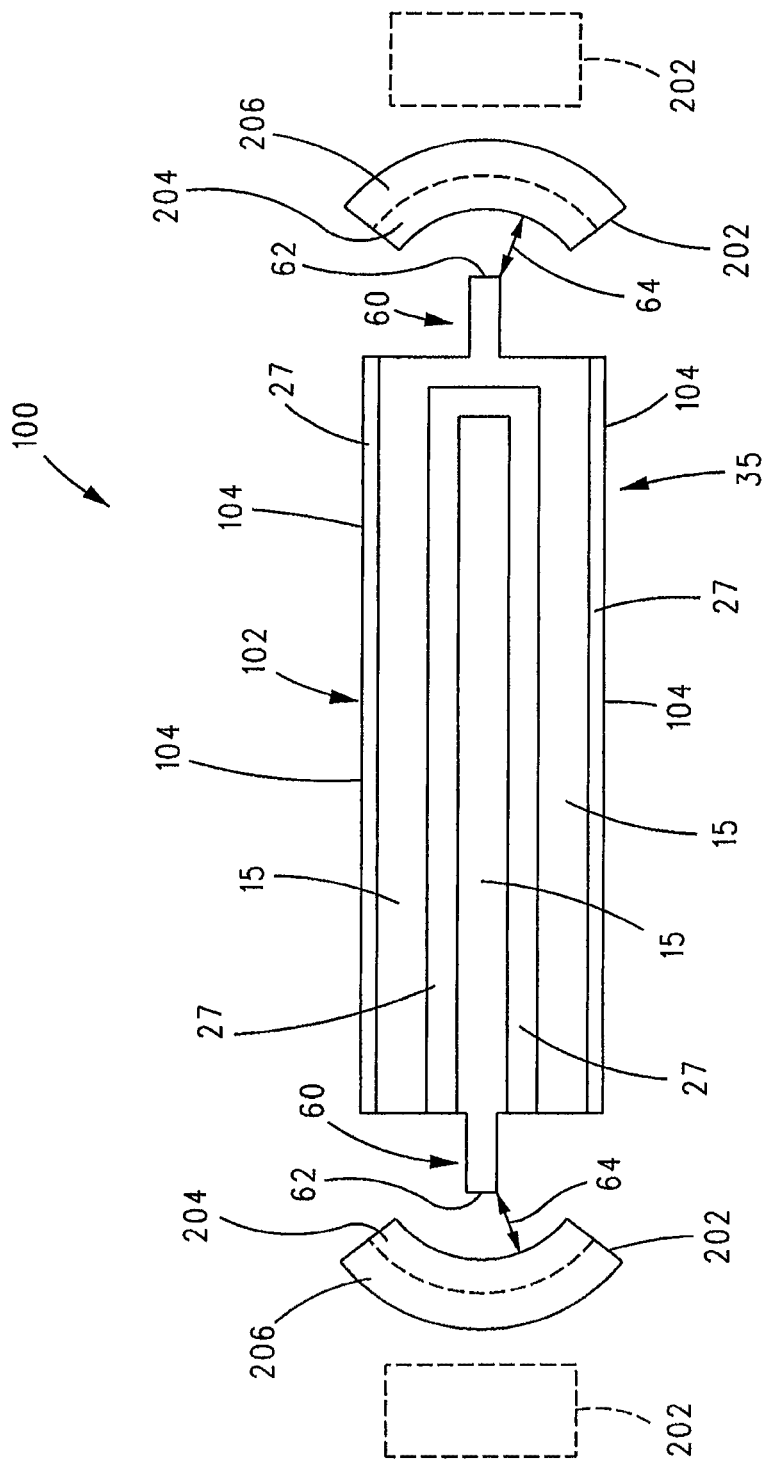
FIG. 3 is a plan view of one non-limiting embodiment or example acoustic resonator, e.g., similar to the acoustic resonator of any one of FIGS. 1A-1C, including two tethers, one tether at each end, wherein proximate each tether is an acoustic reflector mirror.

With reference to FIG. 3 and with continuing reference to all previous figures, in some non-limiting embodiments or examples, in plain view, acoustic resonator 100 can have top electrode 35 in the form of a comb-shaped or interdigitated array of electrical conductor lines 15 and can have a main body 102 that can be at least partially isolated from the surrounding environment by one or more tethers 60.

In some non-limiting embodiments or examples, a means for reflecting acoustic waves can be located on the side of a tether 60 opposite main body 102. In some non-limiting embodiments or examples, the means for reflecting acoustic waves can be a mirror 202, e.g., a straight mirror, (shown in phantom in FIG. 3) or a curved mirror (shown in solid line in FIG. 3). The illustration of a curved mirror and a straight mirror proximate each tether 60 in FIG. 3 is for illustration purposes and is not to be construed in a limiting sense since it is envisioned that only single mirror 202, albeit a straight mirror or a curved mirror, may be disposed proximate each tether 60.

In some non-limiting embodiment or examples, each mirror 202 can be made from any suitable and/or desirable low acoustic impedance material now known or hereinafter developed. In an example, each mirror 202 can be comprised of a low acoustic impedance solid-phase material; a low acoustic impedance gas-phase material, a low acoustic impedance liquid-phase material, or some combination thereof that is/are compatible with the materials forming acoustic resonator 100 and/or a supporting structure to which acoustic resonator 100 and/or each mirror 202 may be coupled or mounted.

In some non-limiting embodiments or examples, the profile of the curved mirror 202 in FIG. 3 may be circular, parabolic, hyperbolic, etc., with the aim of maximizing reflection of an acoustic wave exiting main body 102 by each tether 60 back to the main body 102 which may increase the Q of acoustic resonator 100 and/or which may possibly lower insertion loss.

In some non-limiting embodiments or examples, each mirror 202 may be a multilayered structure including alternating layers of different acoustic impedance materials, e.g., materials 204 and 206. In an example, materials 204 and 206 may be gas-phase and solid-phase materials, or vice versa. However, this is not to be construed in a limiting sense.

In some non-limiting embodiments or examples, a shortest distance 64 of mirror 202 to a distal end 63 of a tether 60 can be ⅛ (or more) of the wavelength of the acoustic wave produced in use of acoustic resonator 100. The inside diameter of a circular mirror 202 can be ⅛ (or more) of the wavelength of the acoustic wave produced in use of acoustic resonator 100. A major and/or minor axis length of a parabolic or a hyperbolic mirror can be ⅛ (or more) of the wavelength of the acoustic wave produced in use of acoustic resonator 100. The aim of using a mirror 202 as a means for reflecting acoustic waves, albeit a straight mirror or a curved mirror, is to reflect back≥20%, ≥40%, ≥60%, ≥80%, or ≥90% of the acoustic wave that is not confined inside main body 102 in use of acoustic resonator 100.

Figure 4:
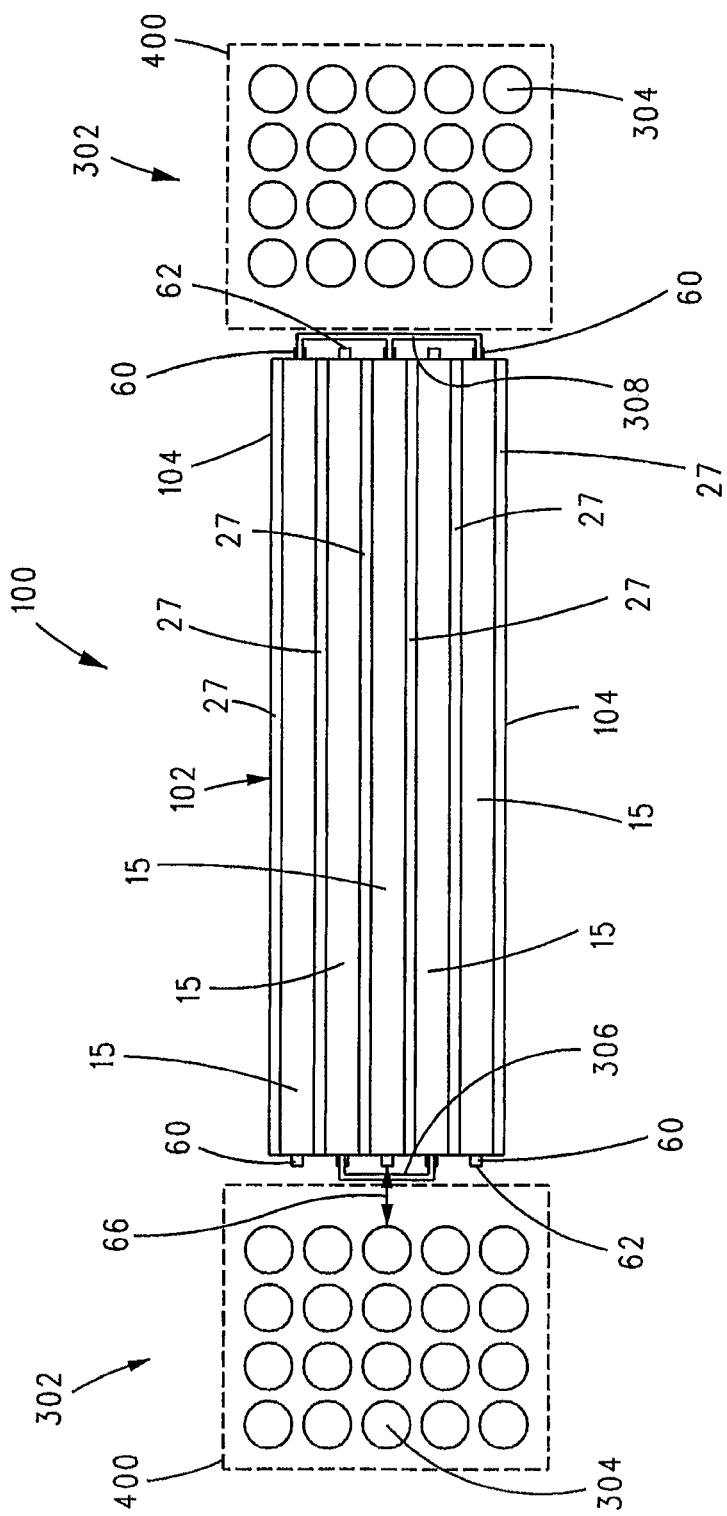
FIG. 4 is a plan view of one non-limiting embodiment or example acoustic resonator, e.g., similar to the acoustic resonator of any one of FIGS. 1A-1C, including, for example, a set of five tethers on each end, wherein proximate each set of tethers is a set or array of phononic crystals.

With reference to FIG. 4 and with continuing reference to all previous figures, in some non-limiting embodiments or examples, in plan view, acoustic resonator 100 can have its main body 102 isolated and anchored by a plurality of tethers 60, e.g., ten tethers 60, to one or more supporting structures 400 (shown in phantom). Supporting structure(s) 400 in FIG. 4 can be a single piece or element coupled to tethers 60 at separate locations or each tether 60 can be coupled to a separate supporting structure 400. The illustration and locations of supporting structure(s) 400 in FIG. 3 is/are for example only and is not to be construed in a limiting sense. For the purpose of description, FIG. 4 will be considered as having two separate supporting structures 400 positioned laterally to a stacking direction of bottom electrode 25 layer, piezoelectric layer 27, and top electrode 35 layer. However, this is not to be construed in a limiting sense.

In some non-limiting embodiments or examples, acoustic resonator 100 can have a plurality of spaced parallel electrical conductor lines 15, e.g., five spaced electrical conductor lines 15, that run from one end of main body 102 to the other end. However, is not to be construed in a limiting sense since the use of other quantities, geometries, and layouts of separate electrical conductor lines 15, e.g., the interdigitated electrical conductor lines 15 discussed above, is envisioned. In the example shown in FIG. 4, portions of piezoelectric layer 27 are visible between each pair of proximate electrical conductor lines 15 and proximate the sides 104 of main body 102. However, this is not to be construed in a limiting sense.

In some non-limiting embodiments or examples, the means for reflecting acoustic waves can be a group, set, or array 302 of phononic crystals 304 that can be formed in a supporting structure 400 coupled to the ends of one or more tethers 60 opposite main body 102. In an example, a first electrode 306 can be used to connect two tethers 60 on one side of main body 102 to one supporting structure 400 that includes one array of phononic crystals 304 while a second electrode 308 on the other side of main body 102 can be used to connect three tether 60 to a second supporting structure 400 that includes another array of phononic crystals 304. An example supporting structure 400 that can be used or adapted for use in the various non-limiting embodiments or examples described herein will be described hereinafter.

In some non-limiting embodiments or examples, the number, shape, size, and/or arrangement of phononic crystals 304 in each array 302 can vary. In an example, the number of phononic crystals in each array 302 can range from 1 to 1,000,000; 1 to 100,000; 1 to 10,000; 1 to 1,000; or 1 to 100. A shortest distance 66 between a distal end 63 of a tether 60 of and one or more phononic crystals 304 can be ⅛ (or more) of the wavelength produced in use of acoustic resonator 100. The aim of phononic crystals 304 is to help confine the acoustic wave produced in use of acoustic resonator 100 to main body 102 for the purpose of attaining a superior Q, and possibly a lower insertion loss. In an example, phononic crystals 304 can confine≥20%, ≥40%, ≥60%, ≥80%, ≥90%, ≥95%, or ≥99% of the acoustic wave inside of main body 102.

FIGS. 5A-5B, show two different plan views of non-limiting embodiment or example acoustic resonators 100 that can be anchored by two tethers 60 (FIG. 5A) (one tether 60 on each end) and five tethers 60 (FIG. 5B) (two tethers on the left end and three on the right end). In some non-limiting embodiments or examples, each tether 60 can include one or more phononic crystal(s) 304 at part of the structure of the tether 60 itself that can act as one or more band stop filters. The ends of each tether 60 opposite main body 102 can be coupled or connected to a supporting structure 400 (shown in phantom). An example of a supporting structure 400 will be described hereinafter.

In some non-limiting embodiments or examples, the phononic crystal(s) 304 of each tether 60 can help confine the acoustic wave produced in use of acoustic resonator 100 to main body 102. The number of phononic crystal(s) 304 of each tethers 60 can range from 1 to 1,000,000; to 100,000; 1 to 10,000; 1 to 1,000; 1 to 100; 1 to 20; or 1 to 10.

In some non-limiting embodiments or examples, the shape of phononic crystals 304 can be square, rectangle, polygon, circle, ellipse, ring, annular, or any other geometric shape. In some non-limiting embodiments or examples, combinations of different shaped phononic crystals 304 maybe used. Each phononic crystal 304 can include one or more open holes, or one or more holes filled with other material, such as material having different acoustic impedance than the material(s) forming the phononic crystal 304.

In some non-limiting embodiments or examples, the phononic crystal(s) 304 of each tether 60 can create a band stop of frequencies that are stopped by said phononic crystal(s) 304. In an example, the band stop frequencies of the phononic crystal(s) 304 can include the resonance frequency of acoustic resonator 100. The aim of phononic crystals 304 is to help confine at least a portion of the acoustic wave produced in use of acoustic resonator 100 to main body 102 for the purpose of attaining a superior Q, and possibly a lower insertion loss.

In some non-limiting embodiments or examples, the phononic crystal(s) 304 of each tether can help reduce acoustic wave energy loss to the supporting structure 400. Some or all of tethers 60 of acoustic resonator 100 can include one or more phononic crystal(s) 304 for achieving a band stop at a desired frequency. Accordingly, the illustration in FIGS. 5A-5B of each tether 60 including six phononic crystal(s) 304 is not to be construed in a limiting sense.

Figure 6:
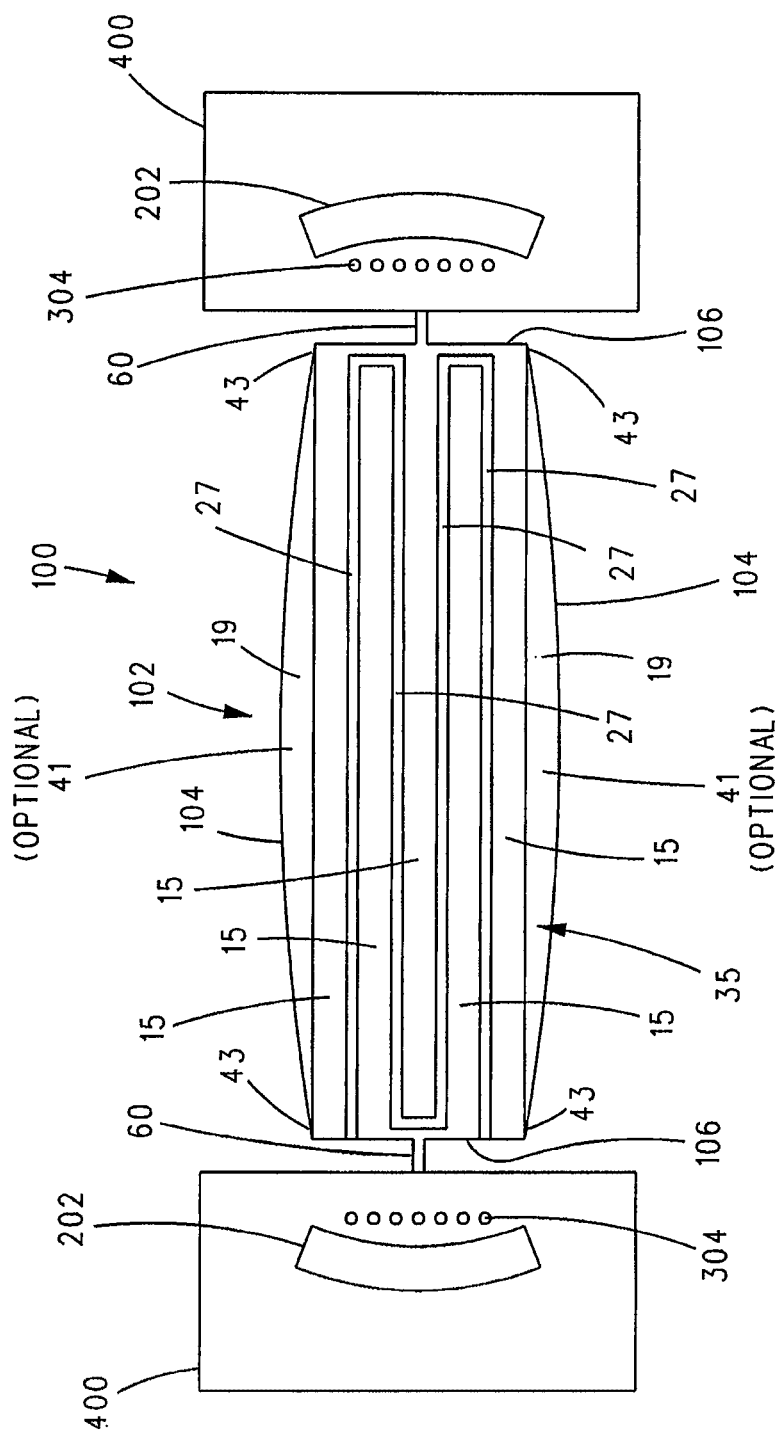
FIG. 6 is a plan view of one non-limiting embodiment or example acoustic resonator in accordance with the principles of the present invention including two tethers (one on each end) and sections or arcs of high acoustic impedance layer, e.g., a diamond layer, visible on one or both sides of the acoustic resonator on which there is/are no piezoelectric layer or electrodes.

With reference to FIG. 6, in some non-limiting embodiments or examples, a supporting structure 400 can be coupled to each tether 60 of acoustic resonator 100. As shown in FIG. 6, for example, acoustic resonator 100 can have interdigitated electrical conductor lines 15. However, this is not to be construed in a limiting sense. In an example, acoustic resonator 100 may include, proximate sides 104 of main body 102, one or more optional areas or portions 41 of high acoustic impedance layer 19 (e.g., diamond) that face upward that may be exposed as shown in the plan view of FIG. 6, i.e., no portion of top electrode 35, piezoelectric layer 27, or bottom electrode 25 (i.e., piezoelectric stack) are atop of the upward facing portion(s) 41 of high acoustic impedance layer 19. In an example, the exposed, upward facing portion(s) 41 of high acoustic impedance layer 19 may be arc shaped, bulging further away from the side(s) of the piezoelectric stack (which may have the rectangular shape shown in FIG. 6) intermediate the ends 106 of main body 102 and gradually arcing toward ends 106 of main body 102. It is believed that having the arc shaped, upward facing portions 41 of high acoustic impedance layer 19 exposed (not covered by portions of the piezoelectric stack) may increase the Q of acoustic resonator 100 and/or may improve the insertion loss of acoustic resonator 100.

This illustration in FIG. 6 of the combination of supporting structure 400 and acoustic resonator having areas or portions 41 that are exposed and are shaped bulging further away from the sides of the piezoelectric stack is not to be construed in a limiting sense since supporting structure 400 and each portion 41 may be provided and used independently of each other.

In some non-limiting embodiments or examples, some or all of the supporting structure(s) 400 may include mirror 202 (albeit a curved or straight mirror) and/or one or more phononic crystals 304. Mirror 202 and/or one or more phononic crystals 304 may be included on a surface of or embedded in the body of each supporting structure 400 in any manner deemed suitable and/or desirable by one skilled in the art. An example of a supporting structure 400, including an optional mirror 202 or one or more phononic crystals 304, connected to a single tether 60 will be described hereinafter with reference to FIG. 8A-8D.

Figure 7:
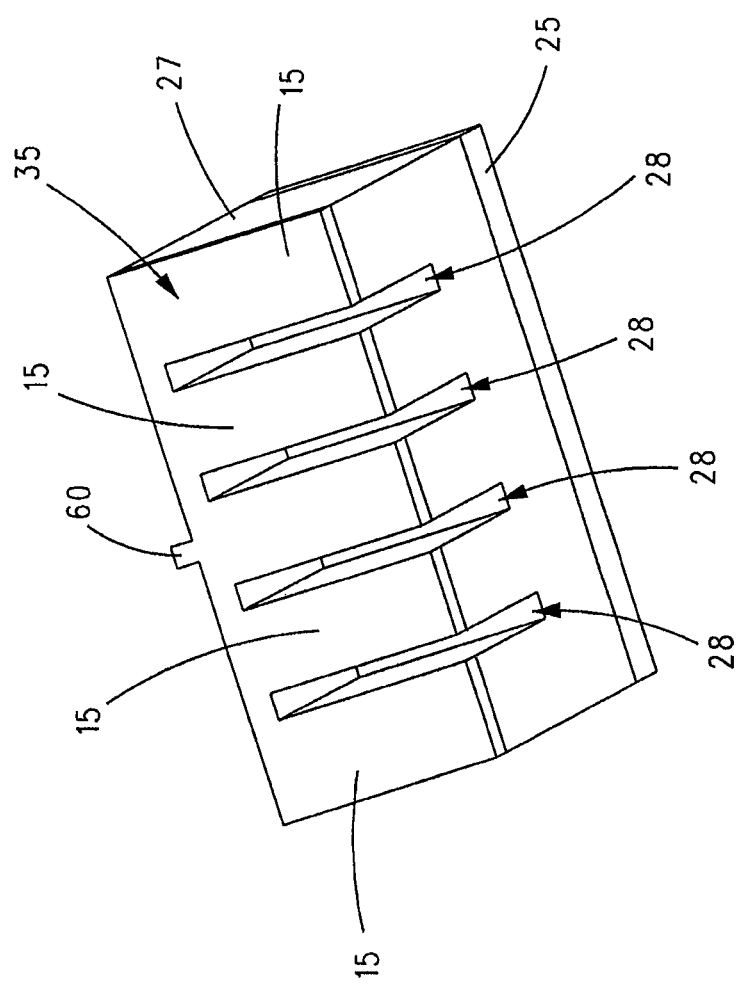
FIG. 7 is an isolated perspective view of one non-limiting embodiment or example piezoelectric stack including a center piezoelectric layer between a top electrode in the form of a sheet and a bottom electrode which can be in the form of a sheet or interdigitated electrical conductors, wherein portions of the top electrode and the piezoelectric layer include slots formed therein to reduce feedthrough and improve signal-to-noise ratio.

FIG. 7 shows a non-limiting embodiment or example isolated portion of acoustic resonator 100 including a piezoelectric stack comprising piezoelectric layer 27, top electrode layer 35 above piezoelectric layer 27, and bottom electrode layer 25 below piezoelectric layer 27.

An acoustic wave reflector comprising at least a high acoustic impedance layer 19 and, optionally, a low acoustic impedance layer 11 and, optionally, one or more of high and/or low acoustic impedance layers 9 and 7 can be positioned under the piezoelectric stack.

In some non-limiting embodiments or examples, high acoustic impedance layer 19 can comprise a layer of diamond. In some non-limiting embodiments or examples, acoustic resonator 100 may also comprise one or more temperature compensation layer(s) 13, 23, and/or 33 (FIGS. 1A-1C).

In the example shown in FIG. 7, portions of piezoelectric layer 27 between proximate electrical conductor lines 15 of top electrode layer 35 can be removed to form one or more slots 28 in the body of piezoelectric layer 27. It is believed that these one or more slots 28 may reduce feedthrough capacitance ($C_0$) of acoustic resonator 100, whereupon the anti-resonance frequency changes according to the reduction in the value of $C_0$, which can lead to an increase in piezoelectric coupling efficiency, or an increase in $kT^2$; where $kT^2 = C_m/C_0$; and Cm is the equivalent motion capacitance. This can allow another degree of freedom to decouple the piezoelectric response (motion current) and the electric response (direct feedthrough due to the capacitive coupling) which can result in an improved signal to noise ratio.

In some non-limiting embodiments or examples, diamond can be one of the most thermally conductive materials known, having a thermal conductivity up to 2000 watts per meter per degree Kelvin, which can make it desirable for applications in thermal management under demanding conditions, for example, optoelectronics, electronics, semiconductor, etc., for devices handling high power in communications and other applications. Diamond can also have a low coefficient of thermal expansion (CTE), which can make it versatile for uses in temperature sensitive applications (such as temperature-related frequency drift in RF communications). Diamond can also be a desirable optical material for transmitting radio frequency electromagnetic wave, microwave, infrared, visible, and other ultraviolet electromagnetic waves. Diamond can also have high stability when used as detector for high fluence nuclear radiation. Diamond can also be highly inert in chemical environment(s) that can involve strong acid, strong base, strong oxidizing agent, or strong reducing agent, even at elevated temperatures or at cryogenic conditions, which can make diamond compatible with different harsh process chemicals. Diamond can also have a high refractive index, which can lead to its use in the jewelry industry and in electromagnetic wave management.

In some non-limiting embodiments or examples, the acoustic velocity for diamond can be 18,500 m/s, which is much higher than that for single crystal silicon (8,500 m/s) and/or silicon carbide (13,300 m/s), as shown in Table 1, below. Acoustic velocity is an intrinsic material property that can be used in making an acoustic resonator. Acoustic resonators are widely used as RF filters, an RF ocillators, RF MEMS switches, and microsystems (sensor). The resonance frequency of an acoustic resonator, e.g., any example acoustic resonator 100 described herein, can be directly proportional to the acoustic velocity of the material forming high acoustic impedance layer 19 and inversely proportional to the geometric dimension of the acoustic resonator or the feature size of acoustic resonator.

In some non-limiting embodiments or examples, acoustic resonator 100 (with a given geometry) that includes diamond as the material of high acoustic impedance layer 19 can resonate at a frequency that is 2.2 times of that of an acoustic resonator made of silicon as the material of high acoustic impedance layer 19. In an example, for a given resonant frequency, an acoustic resonator 100 made of diamond as the material of high acoustic impedance layer 19 can have one or more critical geometric dimensions, e.g., the pitch size of the interdigitated fingers, that can be about 2.2 times smaller than the critical geometric dimension of an acoustic resonator made of silicon as the material of high acoustic impedance layer 19. An acoustic resonator made of diamond as the material of high acoustic impedance layer 19 can also have lower energy loss during vibration, as compared to an acoustic resonator made of silicon as the material of high acoustic impedance layer 19, which can be measured by the Q. The theoretical Q for diamond is around 380,000, as compared to that for silicon, which is around 36,000. The higher the Q value, the lower the energy loss is during vibration.

TABLE 1

Comparison of Acoustic Velocities and Theoretically Predicted Quality Factors at 1 GHz and 3 GHz*.

| Material | $v_a$ (m/S) | Q Theory @ 1 GHZ | Q Theory @ 3 GHZ |
|---|---|---|---|
| Diamond | 18,500 | 380,000 | 380,000 |
| SiC | 13,300 | 320,000 | 116,000 |
| Quartz | 5,720 | 39,000 | 13,000 |
| Si | 8,500 | 36,000 | 36,000 |
| AlN | 10,970 | 8,700 | 3,400 |

In some non-limiting embodiments or examples, diamond as the material of high acoustic impedance layer 19 of acoustic resonator 100 can be grown atop of another layer of acoustic resonator 100 in a reactor via chemical vapor deposition (CVD), where suitable growth conditions can be achieved by microwave-enhanced plasma, tungsten hot-filament, DC-Jet plasma, laser-induced plasma, acetylene-torch, etc. CVD is well known in the art and will not be described further herein.

In some non-limiting embodiments or examples, acoustic resonator 100 having diamond as the material of high acoustic impedance layer 19 can be configured to have both a high quality diamond body and a high quality diamond surface, which can facilitate acoustic resonator 100 having a higher resonant frequency, a higher Q value, or both.

In some non-limiting embodiments or examples, the upward facing surface of diamond as the material of high acoustic impedance layer 19, e.g., the surface facing piezoelectric layer 27, can be finished optically smooth for use as a sound wave medium, such as, for example, as an acoustic wave reflector to transport and reflect acoustic waves, or to conduct heat energy away from an electronic device.

In some non-limiting embodiments or examples, there can be a mismatch in coefficient of thermal expansion between diamond (about $1 \times 10^{-6}$ m/m-K) as the material of high acoustic impedance layer 19 of acoustic resonator 100 and the silicon (about $3 \times 10^{-6}$ m/m-K) that may be material of substrate 50 of acoustic resonator 100.

For the purpose of description only, substrate 50 may be described as being formed of silicon. However, this is not to be construed in a limiting sense, since it is envisioned that substrate 50 may formed of any material, now known or hereinafter discovered, deemed suitable and/or desirable by one skilled in the art.

In some non-limiting embodiments or examples, diamond as the material of high acoustic impedance layer 19 of acoustic resonator 100 may be grown, e.g., via CVD, directly on the silicon forming substrate 50 of acoustic resonator 100. In another example, diamond as the material of high acoustic impedance layer 19 of acoustic resonator 100 may be grown on one or more layers of material formed or deposited above the silicon forming substrate 50 (such as, for example, without limitation, one or more of low acoustic impedance layer 7, high acoustic impedance layer 9, low acoustic impedance layer 11, and/or temperature compensation layer 13) prior to growth of the diamond forming high acoustic impedance layer 19.

In some non-limiting embodiments or examples, acoustic resonator 100 can be formed with any one or more or none of optional layers 7, 9, 11, 13, 19, 23, and 33 shown, for example, in FIGS. 1A-1C. Hence, the illustration in FIGS. 1A-1C of acoustic resonator 100 including optional layers 7, 9, 11, 13, 19, 23, and 33 is not to be construed in a limiting sense.

Hereinafter, "diamond layer" and "high acoustic impedance layer" may sometimes be used interchangeably. However, this is not to be construed in a limiting sense since high acoustic impedance layer may be formed of one or more other materials other than diamond.

With reference back to FIG. 1A, in some non-limiting embodiments or examples, acoustic resonator 100 may comprise substrate 50 made of silicon, e.g., a silicon wafer, and high acoustic impedance material 19 made of CVD grown diamond, wherein an interface 8 between diamond layer 19 and a proximate underlying layer can be optically finished or physically dense with a substantially absence of voids or gaps among the diamond grains. For a lapped, grounded or etched surface on which diamond layer 19 is grown to form interface 8 which can be characterized by the presence of voids or gaps among the diamond grains of diamond layer 19, which can be characterized by its diamond grain density. In an example, the diamond grain density of diamond layer 19 at interface 8 may be $\geq 10^4/cm^2$, $\geq 10^5/cm^2$, $\geq 10^6/cm^2$, $\geq 10^7/cm^2$, $\geq 10^8/cm^2$, or $\geq 10^9/cm^2$. The surface roughness (Ra) of the material or layer on which diamond layer 19 is directly grown, e.g., temperature compensation layer 13, low acoustic impedance layer 11, substrate 50, etc., may be $\leq 100$ nm, $\leq 50$ nm, $\leq 30$ nm, $\leq 20$ nm, $\leq 10$ nm, $\leq 5$ nm, $\leq 2$ nm, or $\leq 1$ nm. In an example, this surface roughness (Ra) may be determined prior to growth of diamond layer 19. In some non-limiting embodiments or examples, a dense diamond layer 19 can enable acoustic wave transport therethrough with minimal wave scattering, versus a diamond layer 19 which is porous which may dampen acoustic wave transport therethrough, e.g., via wave scattering.

In some non-limiting embodiments or examples, the bottom surface 10 of diamond layer 19 at interface 8 may be optically finished after exposing bottom surface 10 of diamond layer 19 or by growth of diamond layer 19 on a top surface of a layer that itself has an optically finished surface. The surface roughness (Ra) of the bottom surface 10 of diamond layer 19 may be $\leq 100$ nm, $\leq 50$ nm, $\leq 30$ nm, $\leq 20$ nm, $\leq 10$ nm, or $\leq 5$ nm. In some non-limiting embodiments or examples, the bottom surface 10 of diamond layer 19 at interface 8 may be physically dense with a substantial absence of voids or gaps among the diamond grains.

In some non-limiting embodiments or examples, an optically finished bottom surface 10 can allow precision control of the geometric dimension of acoustic resonator 100, which in-turn can control an intrinsic acoustic resonance frequency of acoustic resonator 100 (a critical parameter for a RF communication filler, or oscillator, etc.).

In some non-limiting embodiments or examples, acoustic resonator 100 having a dense layer of diamond at interface 8 can avoid acoustic wave scattering and an optically finished bottom surface 10 can allow precision control of acoustic wave reflection. In thermal management, a dense layer of diamond at interface 8 can avoid slow heat conduction in the gas-phase or in a vacuum in the voids or gaps among the diamond grains, taking advantage of fast phonon transport in the diamond material, thereby improving thermal management, which can allow improved power handling in RF communications.

In some non-limiting embodiments or examples, top surface 14 of diamond layer 19 may be optically finished, e.g., by a polishing process prior to forming layers over top surface 14. The surface roughness (Ra) of top surface 14 can be $\leq 100$ nm, $\leq 50$ nm, $\leq 30$ nm, $\leq 20$ nm, $\leq 10$ nm, or $\leq 5$ nm. The optical finish of top surface 14 can be a factor in acoustic wave management for precision control of geometric dimensions, and can enable successful growth of a highly oriented bottom electrode 25 and/or piezoelectric layer 27 which can aid in piezoelectric coupling for acoustic wave resonance.

In some non-limiting embodiments or examples, a top surface of the layer of material on which diamond layer 19 is grown (e.g., the top surface of substrate 50, or the top surface of low acoustic impedance layer 19, or temperature compensation layer 13) can be optically finished or dense prior to growth of diamond layer 19 thereon, whereupon bottom surface 10 of diamond layer 19 can, at least in part, inherit the optical finish from said top surface layer of material during growth of diamond layer 19 thereon.

In some non-limiting embodiments or examples, high acoustic impedance layer 19 (e.g., made of diamond) of acoustic resonator 100 may be any thickness. In some non-limiting embodiments or examples, the thickness of high acoustic impedance layer 19 may be ≤5 microns, ≤10 microns, ≤20 microns, ≤50 microns, ≤100 microns, ≤200 microns, ≤500 microns, or ≤2,000 microns. In an example, the thickness of high acoustic impedance layer 19 may be dictated by the precision needed in acoustic wave resonance, light transport control, and/or efficiency in thermal management.

In some non-limiting embodiments or examples, substrate 50 (e.g., made of silicon) of acoustic resonator 100 may be any thickness. In some non-limiting embodiments or examples, the thickness of substrate 50 can be ≥10 microns, ≥50 microns, ≥100 microns, ≥200 microns, ≥500 microns, ≥2,000 microns, or ≥5,000 microns. The thickness of substrate 50 can be dictated by the needs of applications and the practical needs during the process of fabricating acoustic resonator 100.

In some non-limiting embodiments or examples, substrate 50 of acoustic resonator 100 may be a layer of silicon, e.g., a silicon wafer, that may be undoped or doped, p-type or n-type, monocrystalline or polycrystalline. Said silicon layer can be cut from any crystal direction. Different types of silicon may also be selected for use as the material of substrate 50 for acoustic wave management. For example, in one application, high-electric-resistance silicon may be selected for use as the material of substrate 50. In another example, electrically conductive silicon may be selected, as needed, for use as the material of substrate 50. In yet another application, a single crystal or polycrystalline silicon may be selected for use as the material of substrate 50.

In some non-limiting embodiments or examples, where a silicon wafer is used as substrate 50, said silicon wafer may have any geometric (largest) dimension. In an example, the largest dimension silicon wafer (e.g., diameter) can be ≥25.4 mm, ≥50.8 mm, ≥76.2 mm, ≥101.6 mm, ≥127 mm, or ≥152.5 mm. The diameter of the silicon wafer may be selected and controlled so it can be handled in different fabrication processes.

In some non-limiting embodiments or examples, acoustic resonator 100 can have a total thickness of ≥50 microns, ≥100 microns, ≥150 microns, ≥250 microns, ≥500 microns, ≥1 mm, ≥3 mm, or ≥5 mm. The thickness of acoustic resonator 100 can be dictated by the fabrication process to meet specific application needs.

In some non-limiting embodiments or examples, high acoustic impedance layer 19 formed of a layer of diamond, i.e., diamond layer 19, may be undoped or doped, p-type or n-type, of a quality with Raman half-height-peak-width of ≤20 $cm^{-1}$, ≤15 $cm^{-1}$, ≤10 $cm^{-1}$, or ≤7 $cm^{-1}$. Diamond layer 19 may be polycrystalline, nanocrystalline, or ultrananocrystalline. Doped and conductive diamond layer 19 may be used for a capacitive-driven acoustic resonator 100. Doped and conductive diamond layer 19 may be used as an electrode material of a high-frequency—high Q resonance media for acoustic wave management. The quality of diamond layer 19 may also be selected to achieve a desired level of intrinsic acoustic velocity and low power loss in acoustic resonance. The quality of diamond layer 19 may also affect the thermal conductivity, dictated by the needs in thermal applications, particularly for power handling for a device in RF communications.

In some non-limiting embodiments or examples, the silicon wafer forming substrate 50 may have an aspect ratio of ≥5, ≥10, ≥15, ≥20, or ≥30, where the aspect ratio is defined as the ratio of the longest or largest geometric dimension (such as diameter) over thickness.

Figure 8B:
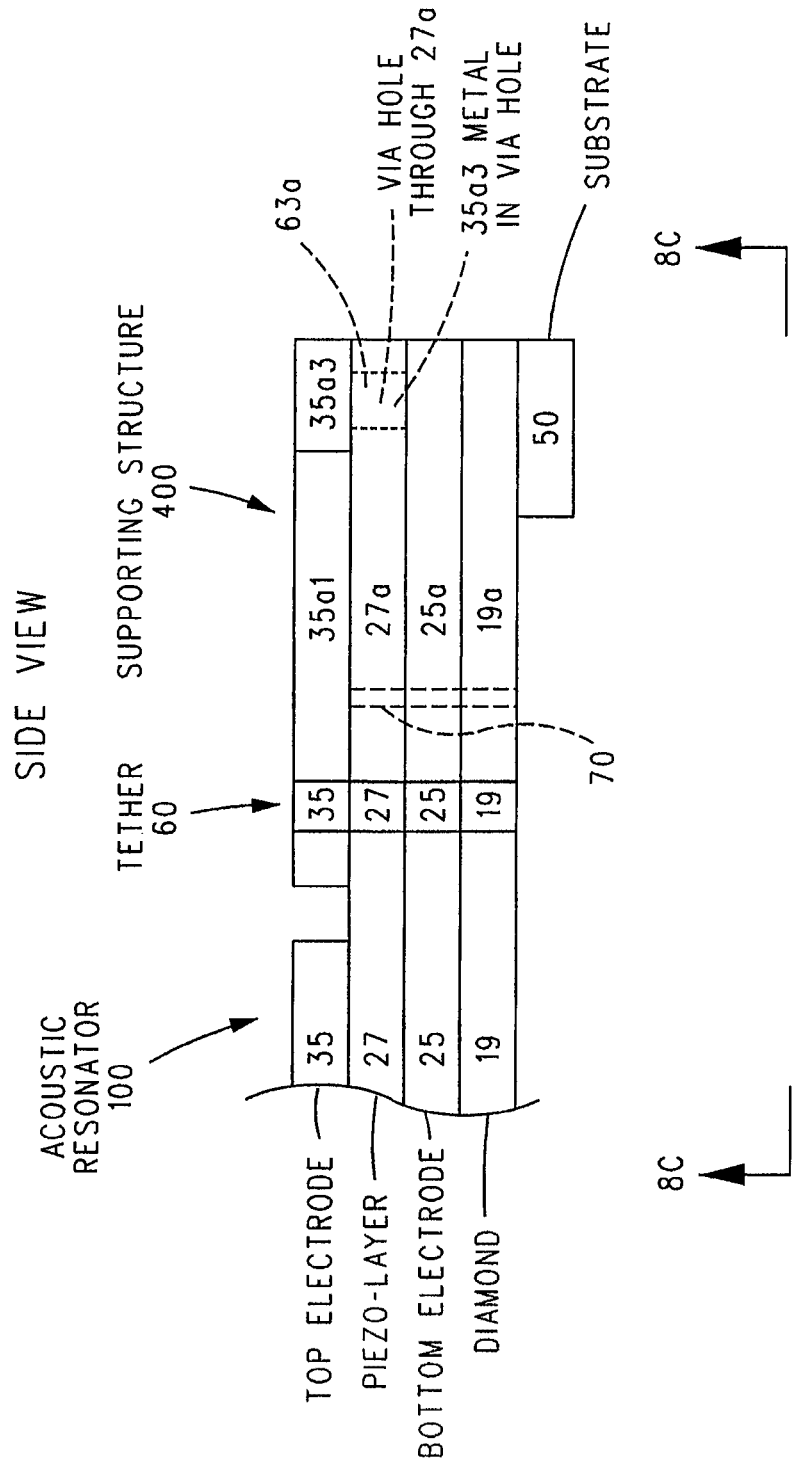

Referring to FIGS. 8A-8D and with continuing reference to all previous figures, in some non-limiting embodiments or examples, an example supporting structure 400 may be connected to an example acoustic resonator 100 via tether 60. In an example, acoustic resonator 100 can include, from top-to-bottom, a stack comprising top electrode 35, piezoelectric layer 27, bottom electrode 25, and diamond layer 19. Tether 60 can be comprised of the same layers of material as acoustic resonator 100 but, as shown in FIGS. 8A and 8C, tether 60 can be formed and have a width that is narrower than the width W of the side or end of acoustic resonator 100.

In an example, acoustic resonator 100 (including tether 60) and supporting structure 400 may be formed as a unitary piece by sequentially depositing on substrate 50: diamond layer 19, bottom electrode 25, piezoelectric layer 27 and top electrode 35. Tether 60 can be formed by the selective removal (etching) of portions of top electrode 35, piezoelectric layer 27, bottom electrode 25 and diamond layer 19 on opposite sides of tether 60, before or after removal (etching) of substrate 50 from below acoustic resonator 100 and below tether 60. In an example, the width of tether 60 can be formed following the completion of the deposition and etching steps used to define the features of acoustic resonator 100 and supporting structure 400 discussed hereinafter. However, this is not to be construed in a limiting sense.

In some non-limiting embodiments or examples, the example supporting structure 400 can include top electrode 35a, piezoelectric layer 27a, bottom electrode 25a, and diamond layer 19a corresponding to and formed at the same time of the same materials as top electrode 35, piezoelectric layer 27, bottom electrode 25, and diamond layer 19 of acoustic resonator 100 and tether 60. The use of suffixes, e.g., "a", with reference numbers in connection with the discussion of the example supporting structure 400 of FIGS. 8A-8D is to facilitate describing the features of supporting structure 400 compared to the features of acoustic resonator 100 and tether 60 and is not to be construed in a limiting sense.

As can be seen in FIGS. 8A and 8C, the width W of supporting structure 400 can be wider than the width of tether 60 and the width of acoustic resonator 100. However, this is not to be construed in a limiting sense since it is envisioned that each of supporting structure 400 and acoustic resonator 100 can have any suitable and/or desirable width including the same width.

Figure 8D:
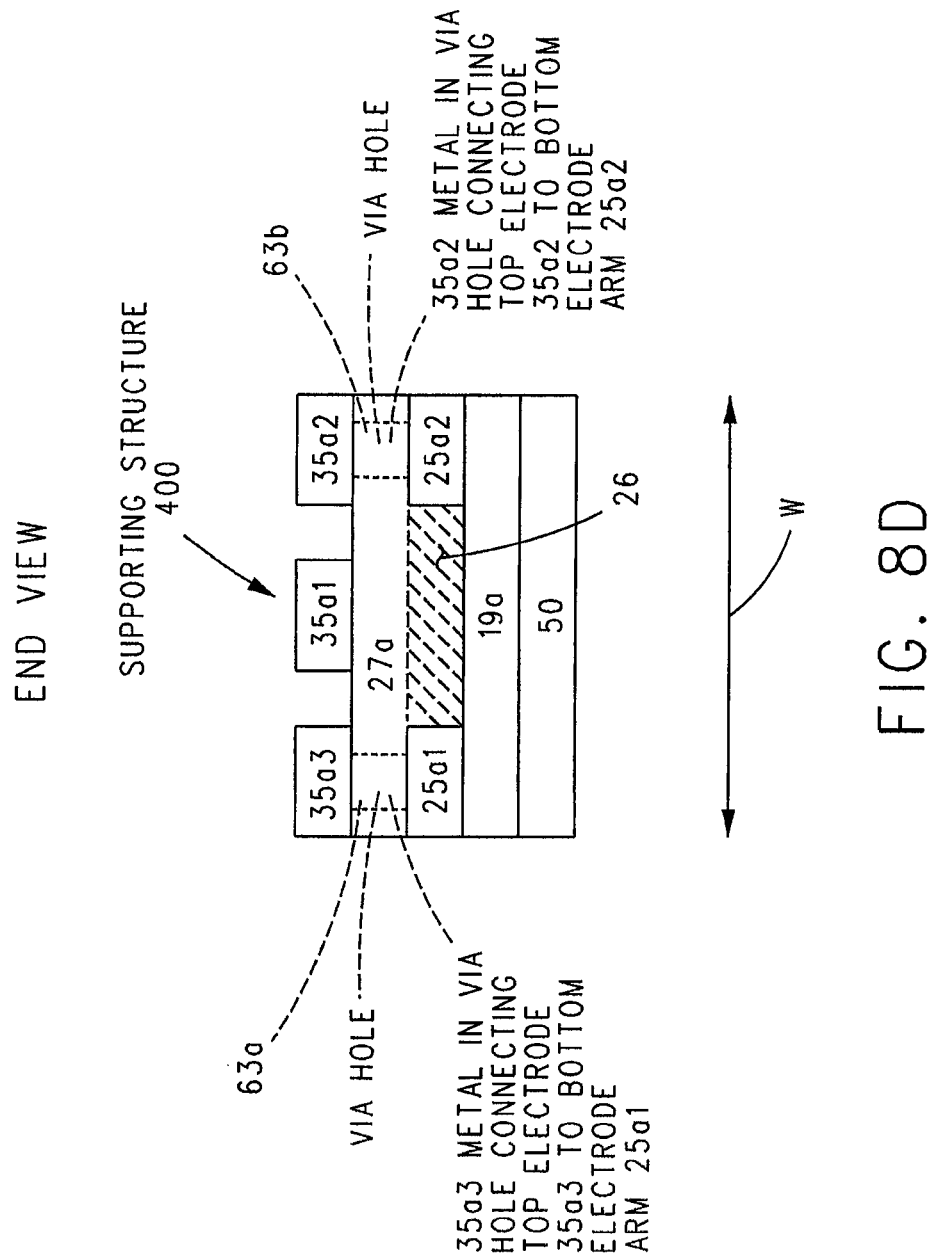

As shown in FIGS. 8B and 8D, in some non-limiting embodiments or examples, the end of supporting structure 400 opposite tether 60 can include (retain) a portion of substrate 50 on a bottom of diamond layer 19a opposite bottom electrode 25a. The portion of substrate 50 shown in FIGS. 8B an 8D can be what remains after etching away substrate 50 from the entire bottoms of acoustic resonator 100 and tether 60, and etching away substrate 50 from the portion of the bottom of supporting structure 400 proximate tether 60.

In some non-limiting embodiments or examples, a mirror image of supporting structure 400 shown connected to tether 60 on the right side of acoustic resonator 100 in FIG. 8A can be connected to the tether 60 on the other (left side) of acoustic resonator 100 shown in FIG. 8A. This other supporting structure 400 is not shown for simplicity of illustration and discussion.

In some non-limiting embodiments or examples, as shown in FIGS. 8C and 8D, during formation of supporting structure 400 and prior to depositing the piezoelectric material that is used to form piezoelectric layers 27 and 27a, a portion of bottom electrode 25a can be selectively removed (etched away) forming a space 26 (shown in phantom in FIG. 8D and as shown outlined by dashed line 30 in FIG. 8C) that can define electrode arms 25a1 and 25a2 on opposite sides of supporting structure 400 and extensions 62 of electrode arms 25a1 and 25a2 that can be connected to bottom electrode 25 of tether 60 and acoustic resonator 100.

In an example, the piezoelectric material forming piezoelectric layers 27 and 27a can then be deposited, for example, in space 26 (on top of the portions of diamond layer 19a exposed by the removal of the portion of bottom electrode 25a from space 26) and on top of electrode arms 25a1 and 25a2, extensions 62, and bottom electrode 25 of tether 60 and acoustic resonator 100.

In some non-limiting embodiments or examples, to facilitate top side electrical connections to bottom electrode arms 25a1 and 25a2 after formation of piezoelectric layer 27a in space 26 and on top of electrode arms 25a1 and 25a2, one or more via holes 63a and 63b may be formed through piezoelectric layer 27a in vertical alignment with portions of bottom electrode arms 25a1 and 25a2, respectively. In an example, shown in FIGS. 8B and 8D, the one or more via holes 63a and 63b may be formed proximate the end of piezoelectric layer 27a opposite tether 60. However, this is not to be construed in a limiting sense.

Next, during the formation or deposition of the metal used to form top electrodes 35 and 35a, said metal can be deposited on piezoelectric layers 27 and 27a and into via holes 63a and 63b thereby forming contacts with the electrode arms 25a1 and 25a2 of bottom electrode 25a. At this point in the formation of acoustic resonator 100 and supporting structure 400, the metal forming top electrodes 35 and 35a is a continuous layer.

In some non-limiting embodiments or examples, the metal forming top electrodes 35 and 35a can then be selectively removed (etched) to form (as shown in FIG. 8A) the pattern of interdigitated fingers of acoustic resonator 100), the electrical arm 35a1 connected to one set of the interdigitated fingers, and one or more top electrode pads 35a2 and 35a3 in contact with electric arms 25a1 and 25a2 by way of via holes 63a and 63b respectively.

In an example, top electrode 35a1 can be utilized to apply electrical stimulus to one set of the interdigitated fingers while the one or more electrode pads 35a2 and 35a3 can be utilized to apply electrical stimulus to bottom electrode 25 (e.g., in the form of a sheet) of acoustic resonator 100 via one or both arms 25a1 and 25a2 and extensions of bottom electrode 25a of supporting structure 400. As can be appreciated, a mirror image of supporting structure 400 connected to the other tether 60 (on the left side in FIG. 8A) of acoustic resonator 100 can be formed in a similar manner and can be connected to the other set of interdigitated fingers of acoustic resonator 100 and, optionally, to bottom electrode 25.

In some non-limiting embodiments or examples, as described above, each supporting structure 400 can include mirror 202, one or more phononic crystals 304, or both that can act as a means for reflecting 70 acoustic waves (shown in phantom in FIG. 8B) exiting acoustic resonator 100 back into acoustic resonator. In an example, means for reflecting 70 acoustic waves can be embedded at least in piezoelectric layer 27a. However, this is not to be construed in a limiting sense since it is envisioned that the means for reflecting 70 acoustic waves can also be included in one or more other layers of supporting structure 400, such as, for example, diamond layer 19a via piezoelectric material 27a in space 26.

Next, a non-limiting embodiment or example method of fabricating acoustic resonator 100 and supporting structure 400 coupled to each tether 60 will be described. Initially, diamond layer 19 is deposited on substrate 50. A layer of bottom electrode 25 material can then be deposited on a side of diamond layer 19 opposite substrate 50. Next, the bottom electrode 25 of each supporting structure 400 is etched to form arms 25a1 and 25a2, extensions 62, and space 25b between arms 25a1 and 25a2 shown in FIG. 8D. Next, piezoelectric material is deposited on bottom electrode 25, on top of the conductive material forming arms 25a1 and 25a2, in space 26 therebetween, and on top of extensions 62 to form piezoelectric layers 27 and 27a.

Next, via holes 63a and 63b are formed in piezoelectric layer 27a to enable top side electrical contact with arms 25a1 and 25a2. Top electrode 35 material is then deposited over piezoelectric layers 27 and 27a, and in via holes 63a and 63b. This top electrode 35 material is then patterned and etched to form the interdigitated fingers of acoustic resonator 100, and contacts 35a1, 35a2, and 35a3, wherein the material of top electrode 35 forming contacts 35a2 and 35a3 extends through via holes 63a and 63b into contact with arms 25a1 and 25a2.

Etching is then performed (in one or more steps) on top electrode 35, piezoelectric layer 27, bottom electrode 25, and diamond layer 19 to define each tether 60 that couples a supporting structure 400 acoustic resonator 100.

Figure 9A:
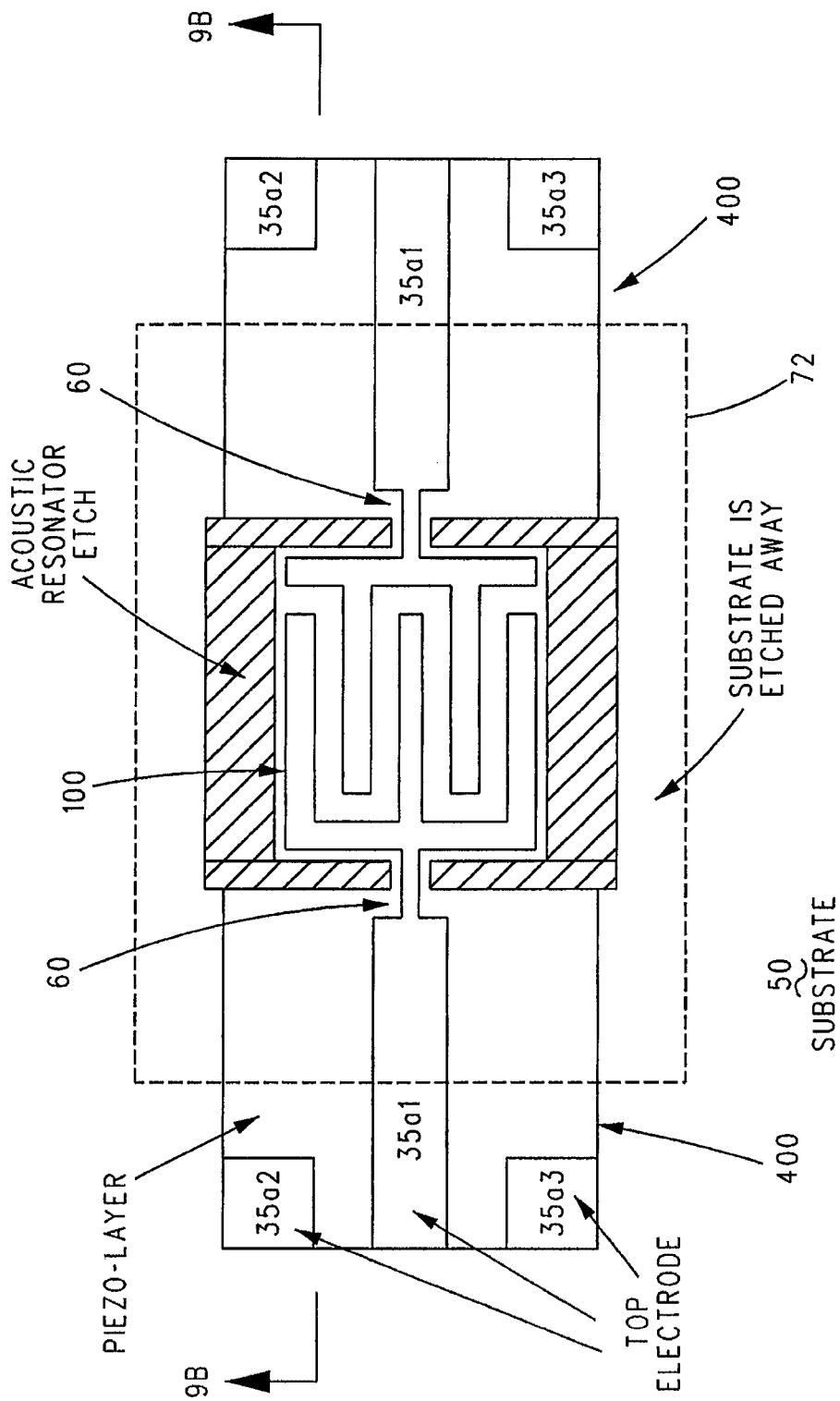
FIGS. 9A-9B are isolated top and side views of an example acoustic resonator coupled (on opposite sides) to a pair of mirror image example supporting structures via a pair of tethers.
Figure 9B:
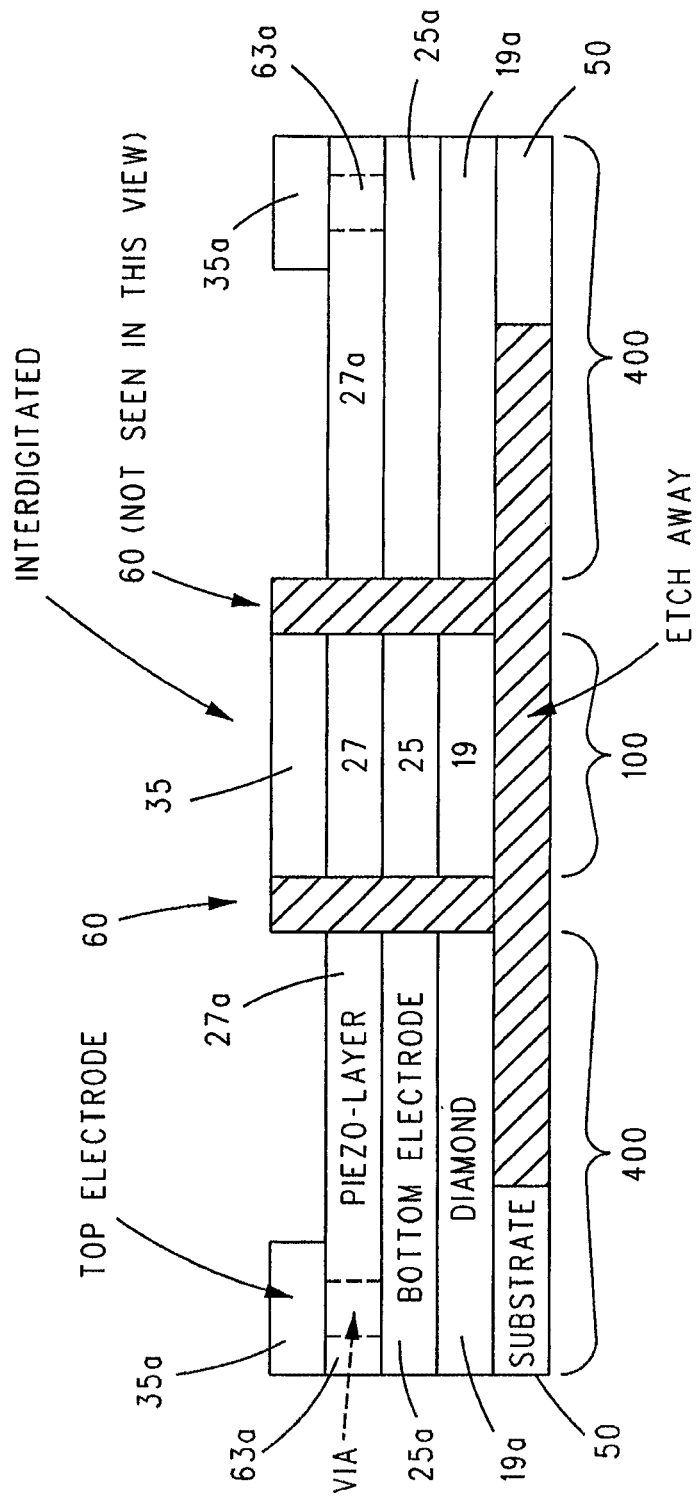

Referring to FIGS. 9A-9B and with continuing reference to FIGS. 8A-8D, substrate 50 beneath acoustic resonator 100, each tether 60, and the portion of each supporting structure 400 proximate acoustic resonator 100 can be removed at any time deemed suitable and/or desirable, for example, after forming each tether 60. However, this is not to be construed in a limiting sense.

Removing substrate 50 from beneath acoustic resonator 100 and each tether 60, and removing the portion of each supporting structure 400 proximate acoustic resonator 100 releases acoustic resonator 100 from substrate 50, whereupon acoustic resonator 100 is held in suspension by at least two supporting structures 400 (e.g., one supporting structure 400 on each side of acoustic resonator 100) via tethers 60 and the un-etched substrate 50 proximate the ends of the supporting structures 400 opposite acoustic resonator 100 shown in FIG. 9B. In other words, acoustic resonator 100 is suspended in space and held fixed in said space by at least a pair of supporting structures 400 via corresponding tethers 60.

In some non-limiting embodiments or examples, substrate 50 can be removed (etched) from at least beneath acoustic resonator 100, from beneath each tether 60, beneath the portion of each supporting structure 400 proximate acoustic resonator 100, and along the sides thereof as shown inside of dashed box 72 in FIG. 9A. Outside of dashed box 72, the material forming substrate 50 can remain. The shape and/or location of dashed box 72 is/are not to be construed in a limiting sense.

An advantage of suspending acoustic resonator in space via tethers 60 is that it allows acoustic resonator 100 to resonate unconstrained by contact with additional materials, other than via tethers 60. In an example, the space surrounding the acoustic resonator can be air, a gas-phase material or mixture, or some level of vacuum. Diamond layer 19 and the air, gas-phase material, or mixture, or vacuum in the space surrounding acoustic resonator 100 can constitute respective high and low acoustic impedance layers 19 and 11. In an example, these high and low acoustic impedance layers can have an acoustic reflectance of 0.9999. High acoustic reflectance may be achieved by use of multiple acoustic wave reflectors, e.g., 37 and 39, each of which can include at least a layer of a high acoustic impedance material and an optional layer of a low acoustic impedance material.

In another example, the piezoelectric layer(s) of tether 6 and/or supporting structure 400 area may act as a dielectric. Accordingly, in an example, these piezoelectric layer(s) can be replaced by any dielectric material, which may be useful in suppressing undesirable parasitic loss of acoustic wave energy.

The invention has been described with reference to various examples which are shown for the purpose of illustration and not limitation. Modification and alterations to the described examples are envisioned. For example, the use of interdigitated fingers on the top surface of any example acoustic resonator is not to be construed in a limiting sense since it is envisioned that electrical stimulus can be applied to the top surface of acoustic resonator 100 and a signal extracted from acoustic resonator 100 in any suitable and/or desirable manner using any suitable and/or desirable structure. Hence, the examples herein of the top surface of any example acoustic resonator including one or more pairs of spaced elongated fingers is not to be construed in a limiting sense. Finally, the various features described herein and illustrated in the figures may be combined or mixed in any manner deemed suitable and/or desirable.

The invention claimed is:

1. An acoustic resonator comprising:
   a plurality of stacked layers comprising:
      a piezoelectric layer having a first surface and a second surface on opposite sides thereof;
      a first electrode layer disposed adjacent the first surface; and
      a second electrode layer disposed adjacent the second surface; and
   a plurality of first acoustic wave reflectors disposed on a side of the second electrode layer opposite the piezoelectric layer,
   wherein each of the first acoustic wave reflectors comprises a first acoustic impedance layer having a first acoustic impedance value (Za) at least as great as $60 \times 10^6$ N·s/m$^3$, and
   wherein at least one of the first acoustic wave reflectors comprises a layer of diamond.

2. The acoustic resonator of claim 1, further comprising a second acoustic impedance layer for at least one of the first acoustic wave reflectors, the second acoustic impedance layer having a second acoustic impedance value (Zb), the second acoustic impedance layer being disposed on a side of an adjacent one of the first acoustic impedance layers opposite the second electrode layer.

3. The acoustic resonator of claim 2, wherein a first absolute value of a difference between the first and second acoustic impedance values (Za, Zb) is at least as great as 40% of a second absolute value of a sum of the first and second acoustic impedance values (Za, Zb).

4. The acoustic resonator of claim 2, wherein the second acoustic impedance value for the second acoustic impedance layer is $65 \times 10^6$ N·s/m$^3$ or less.

5. The acoustic resonator of claim 2, wherein the second acoustic impedance layer comprises a vacuum, a gas-phase material, a gas-phase mixture, a solid-phase material, a ceramic, a glass, a crystal, or a mineral.

6. The acoustic resonator of claim 1, wherein the first acoustic impedance layer comprises a metal, a ceramic, a glass, or a polymer.

7. The acoustic resonator of claim 1, further comprising at least one temperature compensation layer being disposed:
   between the second electrode layer and at least one of the acoustic wave reflectors;
   on a side of at least one of the first acoustic impedance layers opposite the second electrode layer; and/or
   on a side of the first electrode layer opposite the piezoelectric layer.

8. The acoustic resonator of claim 1, further comprising at least one supporting structure disposed laterally to a stacking direction of the stacked layers and being configured to support the stacked layers.

9. The acoustic resonator of claim 8, further comprising a second acoustic wave reflector, the second acoustic wave reflector being associated with the at least one supporting structure and being configured to reflect acoustic waves.

10. The acoustic resonator of claim 8, wherein the at least one supporting structure comprises a tether coupling a side or an end of the stacked layers to the at least one supporting structure.

11. The acoustic resonator of claim 10, further comprising a second acoustic wave reflector, the second acoustic wave reflector being associated with the tether and being configured to reflect acoustic waves.

12. An acoustic resonator, comprising:
   a plurality of stacked layers comprising:
      a piezoelectric layer having a first surface and a second surface on opposite sides thereof;
      a first electrode layer disposed above the first surface; and
      a second electrode layer disposed below the second surface; and
   a plurality of first acoustic wave reflectors disposed on a side of the second electrode layer opposite the piezoelectric layer,
   wherein each of the first acoustic wave reflectors comprises a first acoustic impedance layer having a first acoustic impedance value (Za) at least as great as $60 \times 10^6$ N·s/m$^3$,
   wherein at least one of the first acoustic wave reflectors comprises a second acoustic impedance layer, the second acoustic impedance layer having a second acoustic impedance value (Zb) and being disposed on a side of an adjacent one of the first acoustic impedance layer opposite the second electrode layer, and
   wherein a first absolute value of a difference between the first and second acoustic impedance values (Za, Zb) is at least as great as 40% of a second absolute value of a sum of the first and second acoustic impedance values (Za, Zb).

13. The acoustic resonator of claim 12, further comprising at least one supporting structure coupled to and disposed laterally to a stacking direction of the stacked layers.

14. The acoustic resonator of claim 13, further comprising a second acoustic wave reflector, the second acoustic wave reflector being associated with the at least one supporting structure and being configured to reflect acoustic waves.

15. The acoustic resonator of claim 13, further comprising a tether coupling a side or an end of the stacked layers to the at least one supporting structure.

16. The acoustic resonator of claim 15, further comprising a second acoustic wave reflector, the second acoustic wave reflector being associated with the tether and being configured to reflect acoustic waves.

17. An acoustic resonator, comprising:
   a plurality of stacked layers comprising:

a piezoelectric layer having a first surface and a second surface on opposite sides thereof;

a first electrode layer disposed above the first surface; and a second electrode layer disposed below the second surface;

a plurality of first acoustic wave reflectors disposed on a side of the second electrode layer opposite the piezoelectric layer, each of the first acoustic wave reflectors comprising a first acoustic impedance layer having a first acoustic impedance (Za) at least as great as $60 \times 10^6$ N·s/m$^3$;

at least one supporting structure coupled to and disposed laterally to a stacking direction of the stacked layers;

at least one tether coupling at least one side or at least one end of the stacked layers to the at least one supporting structure; and at least one second acoustic wave reflector associated with at least one of (i) the at least one supporting structure and (ii) the at least one tether, the at least one second acoustic wave reflector being configured to reflect acoustic waves.

18. The acoustic resonator of claim 17, wherein the at least one second acoustic wave reflector is disposed on a side of the at least one tether opposite the stacked layers.

19. The acoustic resonator of claim 18, wherein the at least one second acoustic wave reflector comprises:

a mirror formed of a material having a second acoustic impedance of $65 \times 10^6$ N·s/m$^3$ or less; or one or more phononic crystals.

20. The acoustic resonator of claim 17, wherein the at least one second acoustic wave reflector comprises one or more phononic crystals included in the at least one tether.

* * * * *